United States Patent
Mauder et al.

(10) Patent No.: US 10,566,426 B2
(45) Date of Patent: Feb. 18, 2020

(54) FORMING SILICON OXIDE LAYERS BY RADICAL OXIDATION AND SEMICONDUCTOR DEVICE WITH SILICON OXIDE LAYER

(71) Applicant: Infineon Technologies AG, Neubiberg (DE)

(72) Inventors: Anton Mauder, Kolbermoor (DE); Oliver Hellmund, Neubiberg (DE); Peter Irsigler, Obernberg/Inn (AT); Jens Peter Konrath, Villach (AT); David Laforet, Villach (AT); Maik Langner, Dresden (DE); Markus Neuber, Kesseldorf (DE); Hans-Joachim Schulze, Taufkirchen (DE); Ralf Siemieniec, Villach (AT); Knut Stahrenberg, Dresden (DE); Olaf Storbeck, Dresden (DE)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 15/848,707

(22) Filed: Dec. 20, 2017

(65) Prior Publication Data
US 2018/0175150 A1     Jun. 21, 2018

(30) Foreign Application Priority Data
Dec. 20, 2016   (DE) .................. 10 2016 124 968

(51) Int. Cl.
*H01L 21/02*  (2006.01)
*H01L 29/16*  (2006.01)
(Continued)

(52) U.S. Cl.
CPC .... *H01L 29/1608* (2013.01); *H01L 21/02233* (2013.01); *H01L 21/02255* (2013.01);
(Continued)

(58) Field of Classification Search
CPC ......... H01L 21/28211; H01L 27/10876; H01L 29/1608; H01L 29/4236; H01L 29/66068
See application file for complete search history.

(56) References Cited

U.S. PATENT DOCUMENTS

| 8,154,074 B2 | 4/2012 | Yamamoto et al. |
| 8,902,663 B1 * | 12/2014 | Or-Bach ............. G11C 16/02 365/185.18 |

(Continued)

FOREIGN PATENT DOCUMENTS

| DE | 10 2009 032 274 A1 | 1/2010 |
| DE | 10 2011 107 072 B3 | 11/2012 |
| EP | 2 320 426 A1 | 11/2011 |

OTHER PUBLICATIONS

Trowbridge, Teresa et al., "Enhanced Oxidation of Silicon Nitride using in Situ Steam Generation", Applied Materials, (unknown date).

(Continued)

*Primary Examiner* — Jaewan Oh
(74) *Attorney, Agent, or Firm* — Design IP

(57) ABSTRACT

A body structure and a drift zone are formed in a semiconductor layer, wherein the body structure and the drift zone form a first pn junction. A silicon nitride layer is formed on the semiconductor layer. A silicon oxide layer is formed from at least a vertical section of the silicon nitride layer by oxygen radical oxidation.

27 Claims, 17 Drawing Sheets

(51) Int. Cl.
*H01L 21/28* (2006.01)
*H01L 29/51* (2006.01)

(52) U.S. Cl.
CPC .. *H01L 21/02447* (2013.01); *H01L 21/28176* (2013.01); *H01L 29/51* (2013.01)

(56) References Cited

U.S. PATENT DOCUMENTS

| | | | |
|---|---|---|---|
| 9,252,011 | B2 | 2/2016 | Niess et al. |
| 2002/0160623 | A1* | 10/2002 | Kakkad ............ H01L 21/02238 438/771 |
| 2004/0043638 | A1 | 3/2004 | Nansei et al. |
| 2004/0212011 | A1* | 10/2004 | Ryu ................ H01L 29/66068 257/335 |
| 2009/0206381 | A1* | 8/2009 | Shin ................ H01L 23/5254 257/300 |
| 2010/0193796 | A1 | 8/2010 | Nakano |
| 2011/0237047 | A1* | 9/2011 | Jang ................ H01L 21/28211 438/430 |
| 2012/0049902 | A1* | 3/2012 | Corona ............ H01L 21/02381 327/109 |
| 2012/0094476 | A1 | 4/2012 | Tanaka et al. |
| 2012/0217513 | A1 | 8/2012 | Tega et al. |
| 2013/0178030 | A1 | 7/2013 | Ramkumar et al. |
| 2014/0061780 | A1* | 3/2014 | Son ................ H01L 21/28008 257/330 |

OTHER PUBLICATIONS

Noborio, Masato et. al., "Enhanced Channel Mobility in 4H-SiC MISFETs by Utilizing Deposited SiN/SiO2 Stack Gate Structures", Materials Science Forum, vols. 600-603 (2009), pp. 679-682.

Storbeck, Olaf, Wieland Pethe and Regina Hayn, "A Growth Kinetics Model for the Radical Oxidation of Silicon", Materials Science Forum, vols. 573-574 (2008) pp. 147-152, http://www.scientific.net.

* cited by examiner

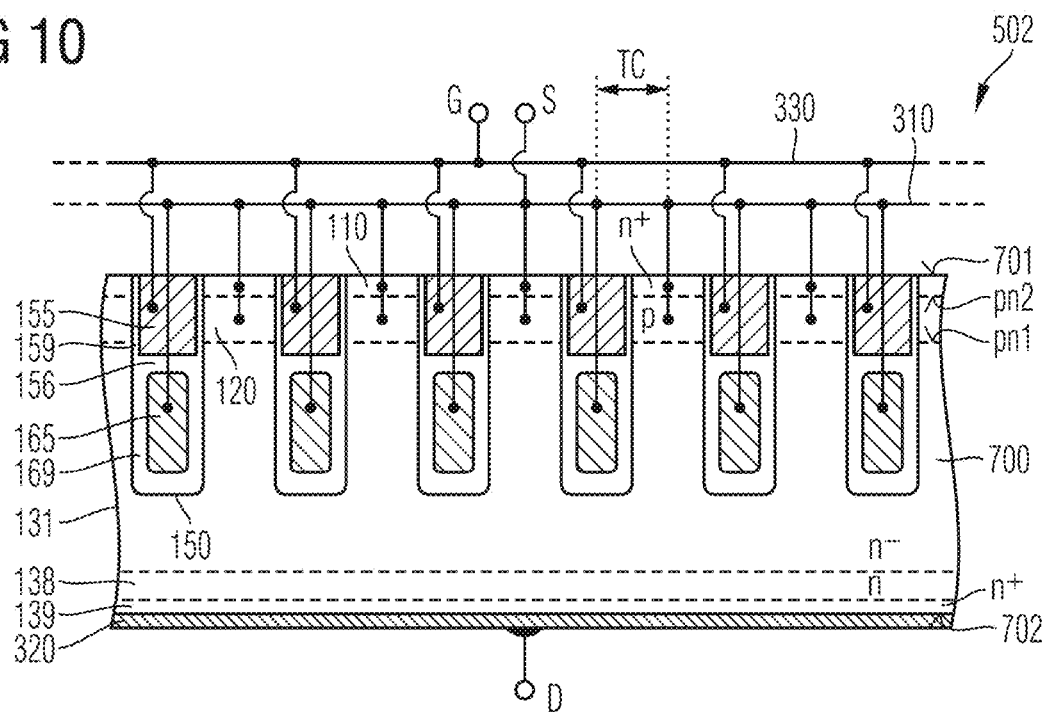
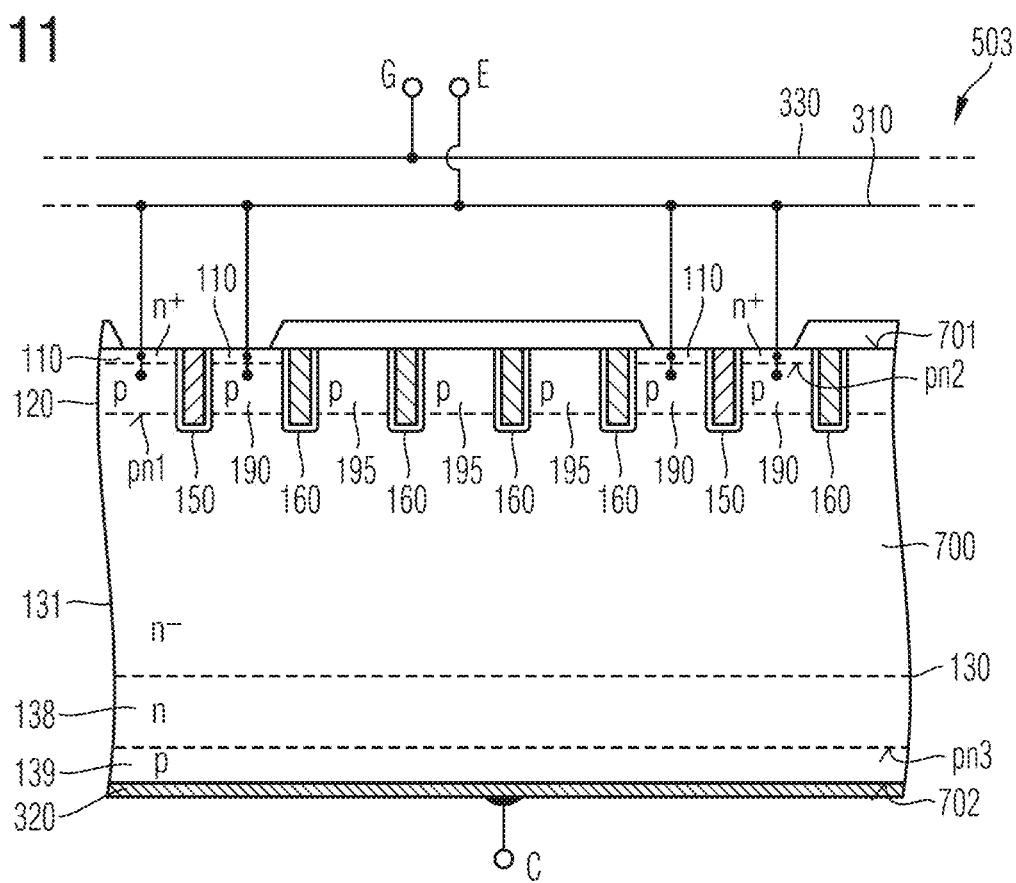

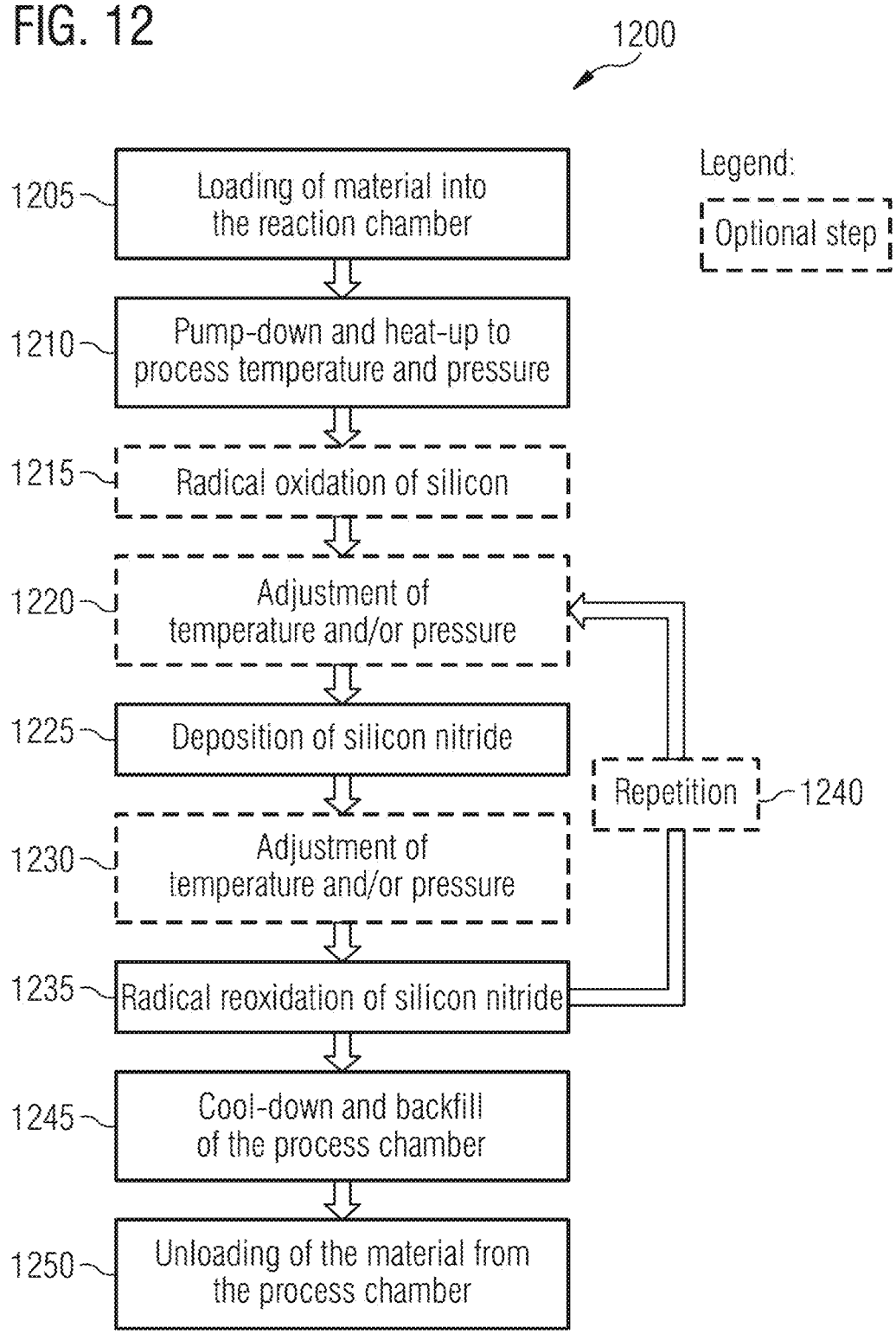

FORMING SILICON OXIDE LAYERS BY RADICAL OXIDATION AND SEMICONDUCTOR DEVICE WITH SILICON OXIDE LAYER

BACKGROUND

Silicon oxide layers may be formed by deposition on or thermal oxidation of a silicon-containing substrate. For thermal oxidation the silicon-containing substrate is subjected to a heat treatment at temperatures between 800° C. and 1200° C., wherein dry oxidation uses molecular oxygen and wet oxidation uses water vapor as oxidant. Since impurities dissolve differently in silicon and oxide, thermal oxidation may result in that the growing silicon oxide absorbs impurities from the silicon-containing substrate. Deposited oxide, on the other hand, typically shows lower density and less conformity.

There may be a need for providing enhanced methods for forming a silicon oxide.

Further, new generations of power devices follow vertical architectures (e.g., trench power Metal Oxide Semiconductor Field Effect Transistors (MOSFETs)). These vertical power devices are using a trench for gate formation with an aspect ratio (AR) that is typically about 3:1 (but can be as high as 12:1. The challenge for those structures is the conformal formation of a high-quality gate oxide. Some aspects of a high quality gate oxide are the low gate leakage at large blocking voltage, the gate oxide is sustaining a high electric field and high reliability.

There may be a need for providing enhanced methods for forming a gate oxide.

In addition, the oxidation of surfaces of silicon carbide wafers has been difficult to achieve. Presently, it is usual practice to deposit chemical vapor depositions (CVD) oxides on the surface of the silicon carbide wafers in order to generate gate oxides, although the oxide quality and the quality of the gate oxide/silicon carbide interface is subject to severe restrictions, depending on the heat treatment method used, owing to the defects in the oxide layer and at the interface. CVD oxides are significantly lower in quality (e.g., the maximum permissible electric field in the gate oxide for a defined reliability) than oxides generated by a thermal oxidation procedure.

The heat treatment processes used at present requires the use of nitrogen monoxide or nitrogen dioxide, which on account of their toxicity or, respectively, their fire-promoting properties, necessitate particular effort and expense in their provision (e.g., double-wall piping, gas alarms, etc.).

The number of interface states can be reduced by means of a plasma-enhanced chemical vapor depositions (PECVD) SiN interlayer, but in this case as well it is necessary to employ a heat-treatment step with NO or $N_2O$.

Thus, there may be provide a method allowing $SiO_2$ layers for gate oxides to be produced on silicon carbide wafers with high quality at acceptable effort and expense.

SUMMARY

According to an embodiment a method of manufacturing a semiconductor device includes forming a body structure and a drift zone in a semiconductor layer, wherein the body structure and the drift zone form a first pn junction. A silicon nitride layer is formed on the semiconductor layer. A silicon oxide layer is formed from at least a vertical section of the silicon nitride layer by oxygen radical oxidation.

According to another embodiment a semiconductor device includes a semiconductor portion including a drift zone and a body structure, wherein the body structure and the drift zone form a first pn junction. A gate dielectric separates a gate electrode from the semiconductor portion. The gate dielectric includes a silicon oxide layer with a nitrogen content in a range from 0.01 at % to 2 at %.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate embodiments of the present invention and together with the description serve to explain principles of the invention. Other embodiments of the invention and intended advantages will be readily appreciated as they become better understood by reference to the following detailed description.

FIG. 10 is a schematic vertical cross-sectional view of a portion of a power semiconductor device according to an embodiment referring to an IGFET with field plate electrodes.

FIG. 11 is a schematic vertical cross-sectional view of a portion of a power semiconductor device according to an embodiment referring to an IGBT.

FIG. 12 shows a flow diagram of an in-situ cyclic process of LPCVD nitride deposition and reoxidation according to one or more embodiments.

DETAILED DESCRIPTION

Figure 1A:
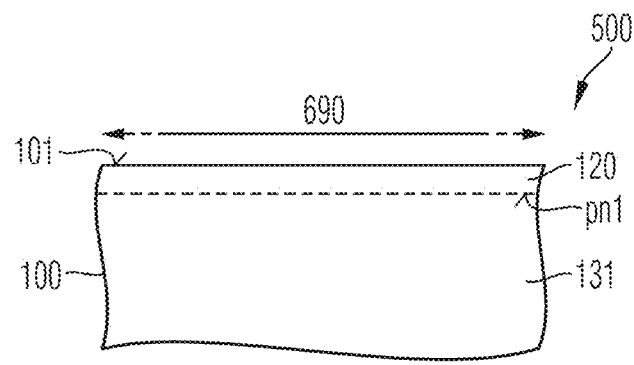
FIG. 1A is a schematic vertical cross-sectional view of a portion of a semiconductor substrate for illustrating a method of manufacturing semiconductor devices, wherein the method includes formation of a silicon oxide layer from a silicon nitride layer by radical oxidation according to an embodiment.

In the following detailed description, reference is made to the accompanying drawings, which form a part hereof and in which are shown by way of illustrations to specific embodiments. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

The term "electrically connected" describes a permanent low-ohmic connection between electrically connected elements, for example, a direct contact between the concerned elements or a low-ohmic connection through a metal and/or a heavily doped semiconductor. The term "electrically coupled" includes that one or more intervening element(s) adapted for signal transmission may be provided between the electrically coupled elements, for example, elements that are controllable to temporarily provide a low-ohmic connection in a first state and a high-ohmic electric decoupling in a second state.

The figures illustrate relative doping concentrations by indicating "−" or "+" next to the doping type "n" or "p". For example, "n$^-$" means a doping concentration which is lower than the doping concentration of an "n"-doping region while an "n$^+$"-doping region has a higher doping concentration than an "n"-doping region. Doping regions of the same relative doping concentration do not necessarily have the same absolute doping concentration. For example, two different "n"-doping regions may have the same or different absolute doping concentrations.

FIGS. 1A to 1D illustrate the formation of a silicon oxide layer 153 on a front surface 101 at a front side of a flat semiconductor layer 100 by oxygen radical oxidation.

Directions parallel to the front surface 101 are horizontal directions. A normal to the front surface 101 defines vertical directions.

A semiconductor substrate 500 is formed from or includes a semiconductor layer 100. For example, the semiconductor substrate 500 is a slice obtained, e.g., by sawing from a single crystalline semiconductor ingot and forms an intrinsic or uniformly doped semiconductor layer 100 from silicon (Si), germanium (Ge), silicon germanium (SiGe), silicon carbide (SiC) or an $A_{III}B_V$ semiconductor. Alternatively, the semiconductor layer 100 may be an intrinsic or weakly doped epitaxial layer on a heavily doped base substrate obtained from a single-crystalline ingot. In some embodiment, the semiconductor layer 100 may be referred to as a semiconductor wafer or, more simply, a wafer.

The semiconductor layer 100 includes a plurality of device regions 690 arranged in rows and columns and separated from each other by a kerf grid. Dopants are implanted through the front surface 101, are at least partially built into the lattice of the semiconductor layer 100 and activated during subsequent heat treatments.

As illustrated in FIG. 1A, the activated dopants form a body structure 120 in a portion of the semiconductor layer 100 adjoining to the front surface 101. The body structure 120 forms a first pn junction pn1 with a drift zone 131, which is formed from an adjoining section of the semiconductor layer 100, wherein at least a portion of the drift zone 131 retains the original doping. Alternatively, the drift zone 131 may include a more heavily doped barrier portion sandwiched between the body structure 120 and a weakly doped drift portion of the drift zone 131, wherein barrier and drift portion have the same conductivity type.

The body structure 120 may include one single body well per device region 690 of the semiconductor layer 100 or may include a plurality of separated body wells per device region 690. The body structure 120 or portions thereof may directly adjoin the front surface 101. Source zones forming second pn junctions with the body structure 120 may be sandwiched between the front surface 101 and the body structure 120.

A deposition process, for example, atmospheric pressure chemical vapor deposition (APCVD) or plasma-enhanced chemical vapor deposition (PECVD) forms a silicon nitride layer 152 on the front surface 101. According to an embodiment the silicon nitride layer 152 is deposited by LPCVD (low pressure chemical vapor deposition), which forms a highly uniform layer with high integrity, i.e., a high number of completed bonds, a low number of defects and a stoichiometric $Si_3N_4$ layer. The formation of the silicon nitride layer 152 may include a short RTP (rapid thermal process) for annealing the silicon nitride layer 152 and forming a thermal silicon nitride at the interface between the silicon nitride layer 152 and the semiconductor layer 100.

Figure 1B:
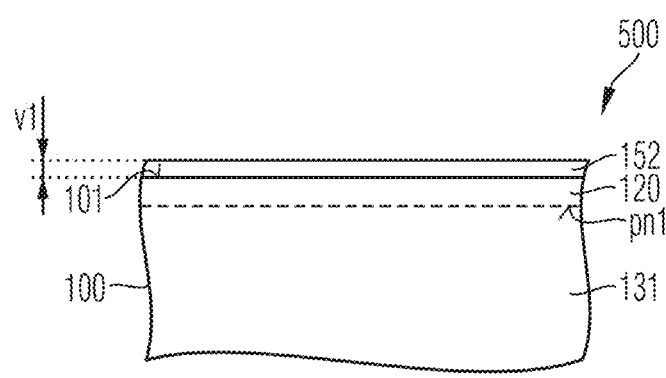
FIG. 1B is a schematic vertical cross-sectional view of the semiconductor substrate portion of FIG. 1A, after forming a silicon nitride layer on a front surface of the semiconductor substrate.

FIG. 1B shows the silicon nitride layer 152 covering at high layer uniformity the front surface 101. A vertical extension v1 of the silicon nitride layer 152 may be in a range from 10 nm and 30 nm, for example, from 15 nm to 25 nm.

At least a vertical section of the silicon nitride layer 152 is transformed into a silicon oxide layer 153 by oxygen radical oxidation.

Figure 1C:
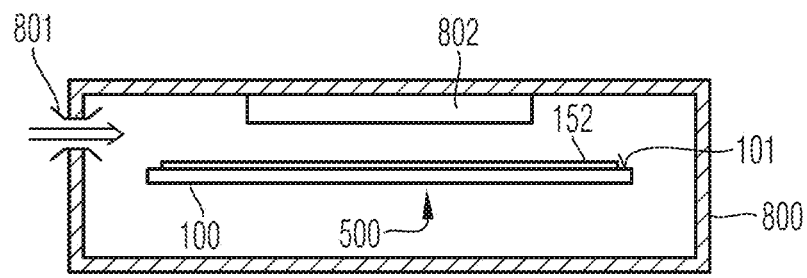
FIG. 1C is a schematic cross-sectional view of a process chamber including the semiconductor substrate of FIG. 1B during radical oxidation.

FIG. 1C shows a process chamber 800 with inlets 801 feeding an oxygen-bearing gas, such as $O_2$, $O_3$, NO, $N_2O$. An excitatory unit 802 produces a substantial amount of atomic oxygen in close vicinity and high uniformity across the silicon nitride layer 152. The excitatory unit 802 may provide localized heat, an electron beam, a flux of photon, or plasma.

For example, the inlets 801 feed, in addition to an oxygen-bearing gas, a compound containing fluorine such that the silicon nitride layer 152 is exposed to a mixture of an oxygen reactant and a dilute amount of fluorine at a temperature sufficiently high to substantially cause the oxidation of the silicon nitride layer 152. For example, the compound containing fluorine is $NF_3$ and the temperature in the process chamber is at least 600° C.

According to another embodiment molecular hydrogen $H_2$ and molecular oxygen $O_2$ are fed into a reactor at a sufficient low pressure and at conditions inhibiting a reaction of the molecular oxygen $O_2$ and the molecular hydrogen $H_2$ in a gas phase, e.g., in a low pressure environment of at most 100 Torr, e.g., at less than 1 Torr and at a temperature of at least 600° C., wherein oxygen and hydrogen react to rapidly oxidize the silicon nitride layer 152 and convert the silicon nitride layer 152 into a silicon oxide layer 153 in an in-situ steam generation (ISSG) process. Alternatively, the excitatory unit 802 may generate a microwave (uWave) plasma along a front side of the semiconductor layer 100, wherein radical oxidation can take place at temperatures below 300° C., e.g., at 200° C. or less. Thus, ISSG oxidation and microwave oxidation are two different possibilities to achieve the $SiO2$ either at higher (ISSG) or lower (uWave) temperatures.

Figure 1D:
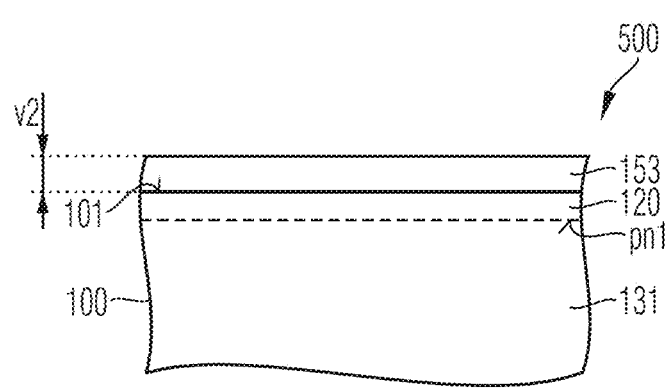
FIG. 1D is a schematic vertical cross-sectional view of the semiconductor substrate portion of FIG. 1B, after forming a silicon oxide layer from the silicon nitride layer by oxygen radical oxidation.

FIG. 1D shows a silicon oxide layer 153 that is formed by transforming the complete silicon nitride layer 152 of FIG. 1C into a silicon oxide layer 153.

A vertical extension v2 of the silicon oxide layer 153 is about 10% greater than the vertical extension v1 of the silicon nitride layer 152 of FIG. 1B.

The silicon oxide layer 153 may form at least a sub-layer of a gate dielectric, of an isolation layer lining trenches extending from the front surface 101 into the semiconductor layer 100, a dielectric liner for conductive structures above the front surface 101, a pad oxide of a hard mask stack, or a surface passivation layer, by way of example.

Compared to a silicon oxide layer formed by conventional thermal oxidation of a silicon-containing semiconductor layer 100 in a furnace, the total temperature budget applied to the semiconductor layer 100 of FIGS. 1A to 1D is significantly reduced. Hence a degree of segregation of dopants, for example, absorption of boron atoms from the body structure 120 into the silicon oxide layer 153 is significantly reduced. The formation of the silicon oxide layer 153 gets along without consuming silicon from a portion of a silicon-containing semiconductor layer 100 along the front surface 101 such that edges and corners of silicon structures remain unaffected. The rate at which the silicon nitride layer 152 of FIG. 1C transforms into the silicon oxide layer 153 shows no dependence from the orientation of crystal lattice planes in the underlying semiconductor layer 100 such that thickness uniformity of the silicon oxide layer 153 is high even when the silicon oxide layer 153 covers a patterned front surface 101 with protrusions and trenches.

Figure 2A:
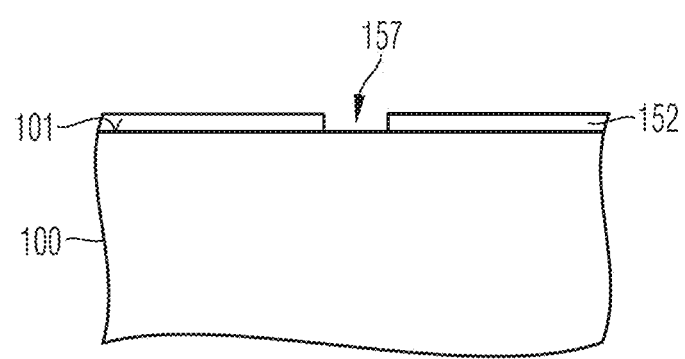
FIG. 2A is a schematic vertical cross-sectional view of a portion of a semiconductor substrate including a silicon nitride layer with a pin hole for discussing effects of the embodiments.
Figure 2B:
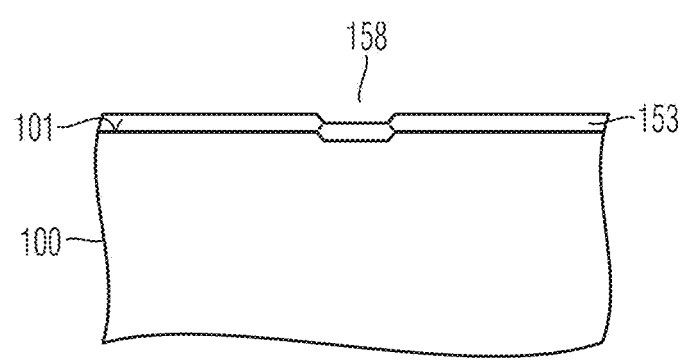
FIG. 2B is a schematic vertical cross-sectional view of the semiconductor substrate portion of FIG. 2A, after oxygen radical oxidation.

In addition, the two-step process of depositing a sacrificial silicon nitride layer 152 and transforming the silicon nitride layer 152 into a silicon oxide layer 153 results in a high reliable silicon oxide layer 153 without leakage paths as illustrated in FIGS. 2A and 2B.

FIG. 2A shows a silicon nitride layer 152 with a pin hole 157. When the silicon nitride layer 152 is transformed into a silicon oxide layer 153 by oxygen radical oxidation, the oxidation process also oxidizes the semiconductor material of the semiconductor layer 100. In case the semiconductor layer 100 is a silicon layer or a silicon carbide layer, the semiconductor layer 100 oxidizes at a rate similar to a rate at which the silicon nitride layer 152 transforms into the silicon oxide layer 153.

FIG. 2B shows a silicon oxide patch 158 resulting from oxidation of a portion of a silicon-containing semiconductor layer 100 exposed by the pin hole 157 of FIG. 2A. The silicon oxide patch 158 closes the pin hole 157 of FIG. 2A. When radical oxidation stops when the sacrificial silicon nitride layer 152 of FIG. 2A is completely transformed into silicon oxide, a thickness of the silicon oxide patch 158 deviates by not more than 20% from the thickness of the silicon oxide layer 153. Since the lateral dimensions of the silicon oxide patch 158 are small, the impact on the electric characteristics of the total silicon oxide structure is small. However, a leakage current path in the resulting, insulating silicon oxide layer is blocked.

FIGS. 3A to 3E refer to the formation of a gate dielectric for power semiconductor devices.

A body structure 120 that may include a plurality of separated body wells 121 per device region 690 is formed at a front side of a semiconductor layer 100. A dielectric intermediate layer 151 may be formed on the front surface 101.

Figure 3A:
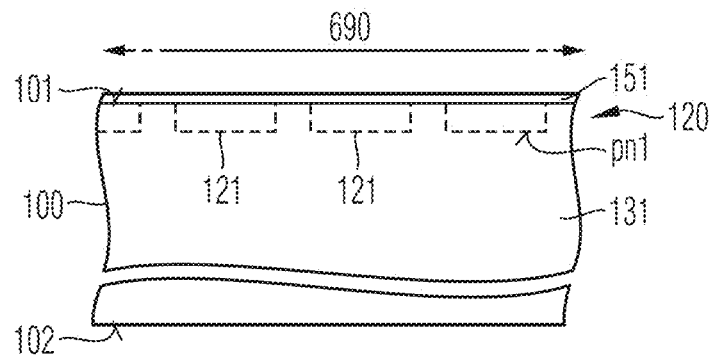
FIG. 3A is a schematic vertical cross-sectional view of a portion of a semiconductor substrate for illustrating a method of manufacturing semiconductor devices according to an embodiment concerning formation of a gate dielectric, after forming an intermediate layer.

FIG. 3A shows the intermediate layer 151 covering the front surface 101 of the semiconductor layer 100. The intermediate layer 151 may be from silicon oxide containing nitrogen as an undesired impurity, i.e., with a nitrogen content less than 0.01 atomic percent (at %). A thickness of the intermediate layer 151 may be at least 3 nm, e.g., at least 5 nm or at least 10 nm. The body structure 120 forms first pn junctions pn1 with a low-doped drift zone 131 between the body structure 120 and a rear side surface 102 parallel to the front surface 101. An LPCVD process may form a silicon nitride layer 152 on the intermediate layer 151.

Figure 3B:
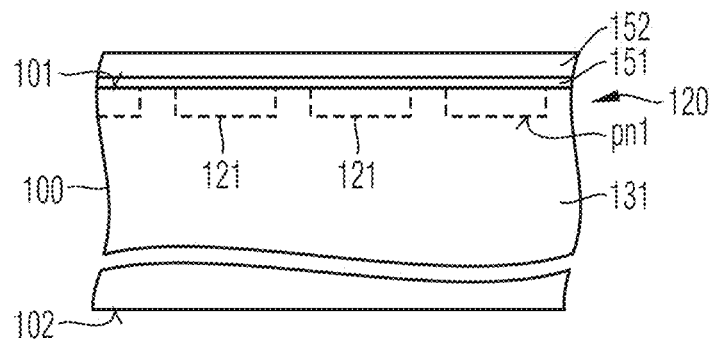
FIG. 3B is a schematic vertical cross-sectional view of the semiconductor substrate portion of FIG. 3A, after forming a silicon nitride layer on the intermediate layer.

FIG. 3B shows the intermediate layer 151 sandwiched between the silicon nitride layer 152 and the front surface 101. A vertical extension v1 of the silicon nitride layer 152 may be at least 10 nm, for example at least 15 nm. A silicon oxide layer 153 is formed from the silicon nitride layer 152 by oxygen radical oxidation at temperatures of at least 600° C. via an ISSG process.

Figure 3C:
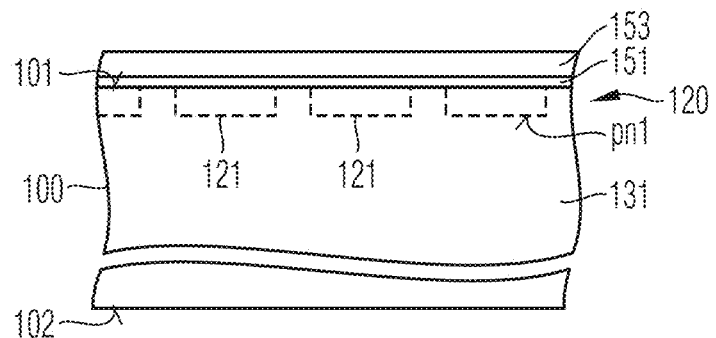
FIG. 3C is a schematic vertical cross-sectional view of the semiconductor substrate portion of FIG. 3B, after oxygen radical oxidation of the silicon nitride layer.

In FIG. 3C the silicon oxide layer 153 has replaced the silicon nitride layer 152 of FIG. 3B.

A conductive material or a layer stack of at least two different conductive materials is deposited on the silicon oxide layer 153 obtained from the silicon nitride layer 152. A patterning step may remove portions of the deposited conductive material or conductive layer stack, the silicon oxide layer 153 and the intermediate layer 151 to selectively expose portions of the front surface 101.

Figure 3D:
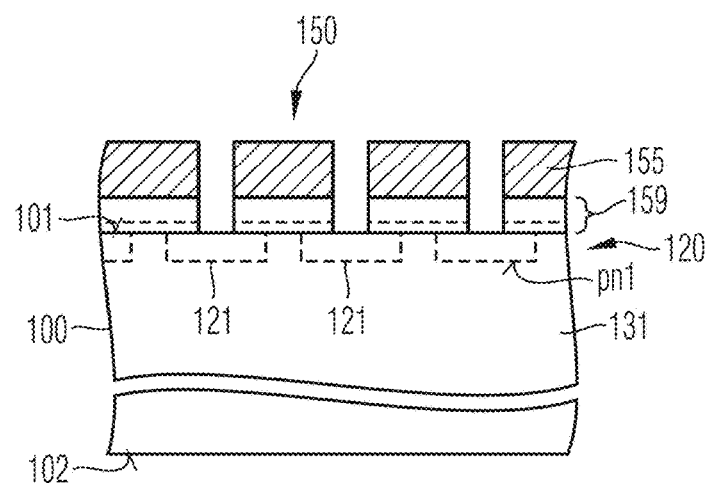
FIG. 3D is a schematic vertical cross-sectional view of the semiconductor substrate portion of FIG. 3C, after forming gate structures.

FIG. 3D shows gate structures 150 formed by patterning the deposited conductive material or conductive layer stack, the silicon oxide layer 153 and the intermediate layer 151. The gate structures 150 include a gate dielectric 159 formed from remnant portions of the intermediate layer 151 and the silicon oxide layer 153 of FIG. 3C and a gate electrode 155 formed from a portion of the deposited conductive material or conductive layer stack.

Source zones 110 may be formed that extend between neighboring gate structures 150 into the separated body wells of the body structure 120. The source zones 110 form second pn junctions pn2 with the body structure 120. A control electrode 330 may be formed that electrically connects separated portions of the gate electrodes 155 at the front side. A first load electrode 310 is formed that is electrically connected to the source zones 110 and to the body wells of the body structure 120. At the rear side, a heavily doped contact structure 139 may be formed in the semiconductor layer 100 along the rear side surface 102. A second load electrode 320 is formed that directly adjoins the second surface 702.

Figure 3E:
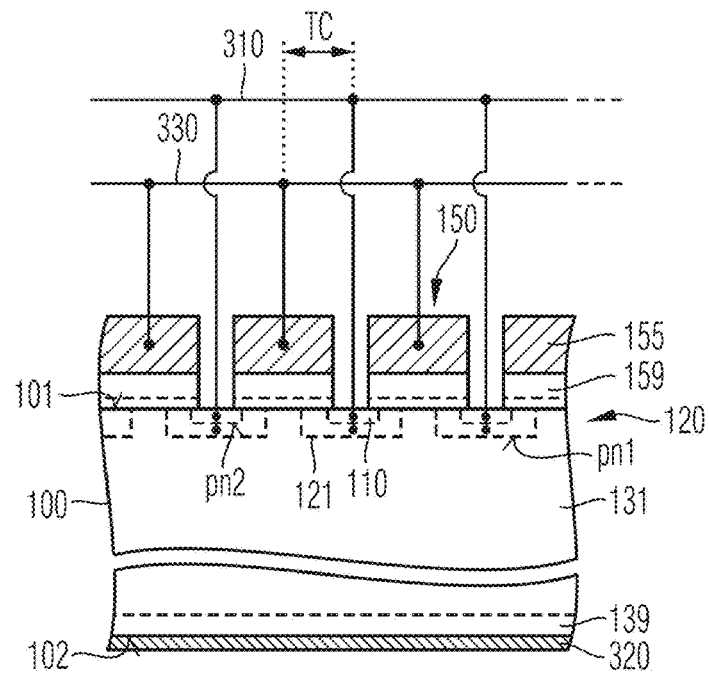
FIG. 3E is a schematic vertical cross-sectional view of the semiconductor substrate portion of FIG. 3D, after forming load electrodes.

FIG. 3E shows a plurality of identical transistor cells TC including portions of a gate structure 150, of a source zone and of the body structure 120, respectively. The transistor cells TC are electrically connected in parallel to each other and control a vertical load current flow between the first load electrode 310 and the second load electrode 320 through the drift zone 131. Then the semiconductor layer 100 may be diced along dicing streets running between neighboring device regions 690.

Due to its origin from a silicon nitride layer, the gate dielectric 159 contains 0.01 at % to 2 at % nitrogen. The nitrogen atoms may be at crystal lattice sites of the crystal lattice of the silicon oxide or may be grouped as nitrogen molecules. The nitrogen atoms and molecules are effective as traps for electrons and as recombination centers for electrons and holes.

Figure 4:
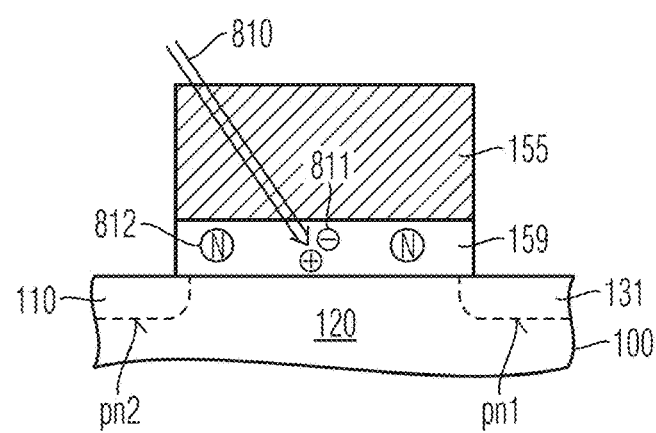
FIG. 4 is a schematic vertical cross-sectional view of a gate structure for discussing effects of the embodiments.

FIG. 4 illustrates the effect of nitrogen atoms in a gate dielectric based on a silicon oxide including at least 0.01 at % nitrogen.

When the gate dielectric 159 is exposed to ionizing radiation 810, for example, neutrons, gamma radiation or high-energetic electron radiation, the ionizing radiation 810 passing the gate dielectric 159 may generate electron-hole pairs 811. The generated electrons are highly mobile and may escape from the gate dielectric 159 or may be trapped at the interface between gate electrode 155 and gate dielectric 159. The holes are widely immobile such that the gate dielectric 159 steadily accumulates positive charge which is effective as a positive voltage bias of the gate electrode 155. As a consequence, the extrinsic threshold voltage of the transistor cell TC steadily drifts to lower values in case of an n-channel transistor. Locally, the threshold voltage may drift to so low values so that leakage current in the transistor is increased and eventually the transistor is destroyed thermally by the leakage current. In case of a p-channel transistor the extrinsic threshold voltage locally drifts to higher voltage. In case the accumulated charge increases further, the gate dielectric 159 may break through which may lead to failure of n- and p-channel transistors.

Instead, in a silicon oxide layer containing 0.01 at % to 2 at % nitrogen, the nitrogen atoms and molecules 812 trap the electrons such that the electrons do not leave the gate dielectric 159 and the gate dielectric 159 remains electrically balanced. The nitrogen atoms and molecules 812 may also increase the intrinsic recombination rate of electron-hole pairs 811 previously generated in the gate dielectric 159. As a consequence, any semiconductor device based on a gate dielectric 159 including a silicon oxide obtained from a silicon nitride layer by oxygen radical oxidation significantly shows higher radiation ruggedness.

Figure 5A:
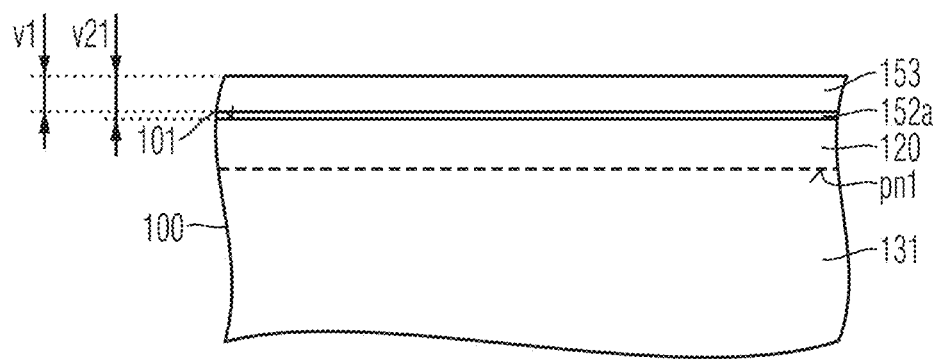
FIG. 5A is a schematic vertical cross-sectional view of a portion of a semiconductor substrate after transforming only a vertical sub-section of a silicon nitride layer into a silicon oxide layer according to an embodiment.
Figure 5B:
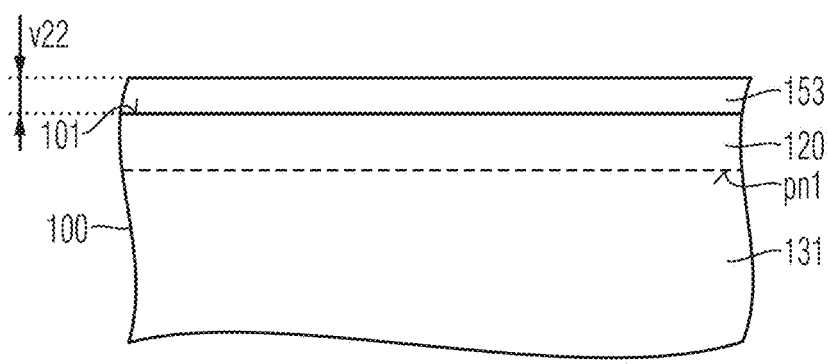
FIG. 5B is a schematic vertical cross-sectional view of a portion of a semiconductor substrate after transforming a complete silicon nitride layer into a silicon oxide layer according to another embodiment.
Figure 5C:
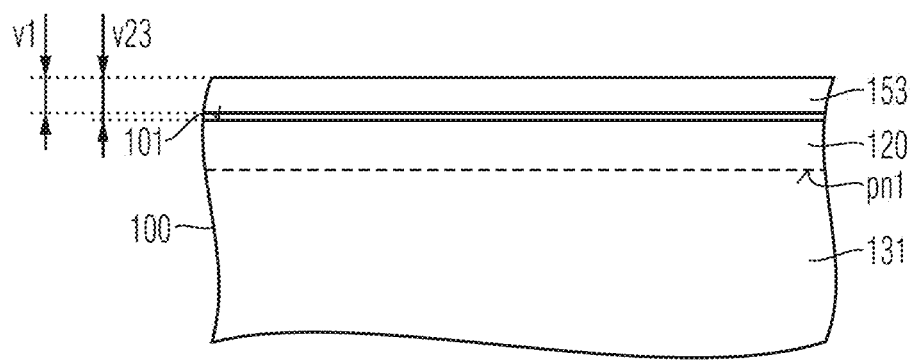
FIG. 5C is a schematic vertical cross-sectional view of a semiconductor substrate portion after forming a silicon oxide layer from a silicon nitride layer and from a portion of a semiconductor substrate according to a further embodiment.

FIGS. 5A to 5C refer to different end points of the radical oxidation process described with regard to FIG. 1C.

FIG. 5A refers to an embodiment with the oxygen radical oxidation terminated before conversion of the complete silicon nitride layer 152 of FIG. 1B into the silicon oxide layer 153 and shows a remnant silicon nitride layer 152a sandwiched between the silicon oxide layer 153 and the front surface 101. A vertical extension v21 of the silicon oxide layer 153 may be smaller than, equal to or at most 10% greater than the vertical extension v1 of the original silicon nitride layer 152 of FIG. 1B.

In FIG. 5B the oxygen radical oxidation is terminated approximately at the front surface 101 and the vertical extension v22 of the silicon oxide layer 153 is about 10% greater than the vertical extension v1 of the original silicon nitride layer 152 of FIG. 1B.

In FIG. 5C the oxygen radical oxidation is terminated only after a few nanometers of the underlying semiconductor layer 100 have been oxidized. A vertical extension v23 of the silicon oxide layer 153 is more than 10% greater than the original silicon nitride layer 152 of FIG. 1B. The front surface 101 is recessed with respect to the original front surface 101 by some few nanometers.

FIGS. 6A to 6D refer to a method of forming dielectrics with a thickness of more than 20 nm.

A first portion 1531 of a silicon oxide layer is formed on the front surface 101 by oxygen radical oxidation of a first silicon nitride layer as described above.

Figure 6A:
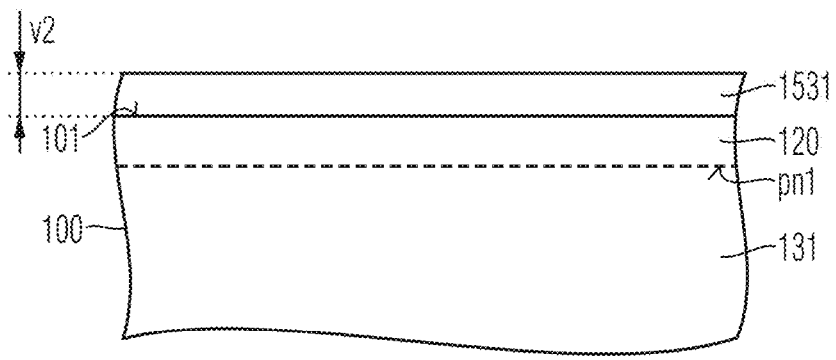
FIG. 6A is a schematic vertical cross-sectional view of a portion of a semiconductor substrate for illustrating a method of manufacturing semiconductor devices according to an embodiment repeating deposition and oxidation of a silicon nitride layer, after forming by radical oxidation a first portion of a silicon oxide layer from a first silicon nitride layer.

FIG. 6A shows the first portion 1531 of a silicon oxide layer 153 with a thickness v2 of at least 10 nm and at most 30 nm on the front surface 101 of a semiconductor layer 100. A second silicon nitride layer 152 is deposited, e.g., by LPCVD on the first portion 1531 of a silicon oxide layer 153.

Figure 6B:
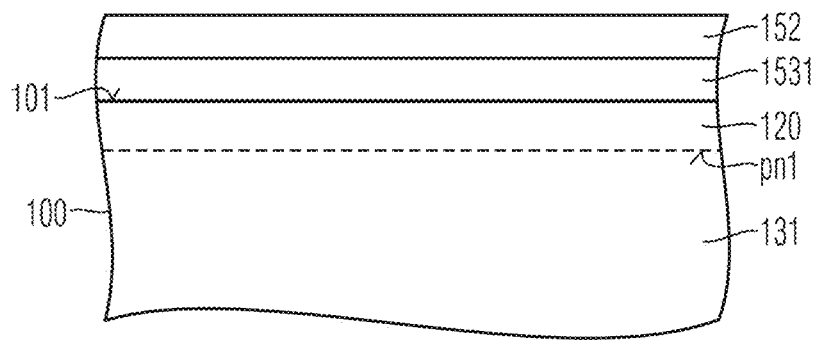
FIG. 6B is a schematic vertical cross-sectional view of the semiconductor substrate portion of FIG. 6A, after forming a second silicon nitride layer on the first portion of a silicon oxide layer.

FIG. 6B shows the second silicon nitride layer 152 formed on the first portion 1531 of a silicon oxide layer. A further oxygen radical oxidation process in a process chamber, which may be same or of the same type as that used for the formation of the first portion 1531 of a silicon oxide layer, forms a second portion 1532 of a silicon oxide layer.

Figure 6C:
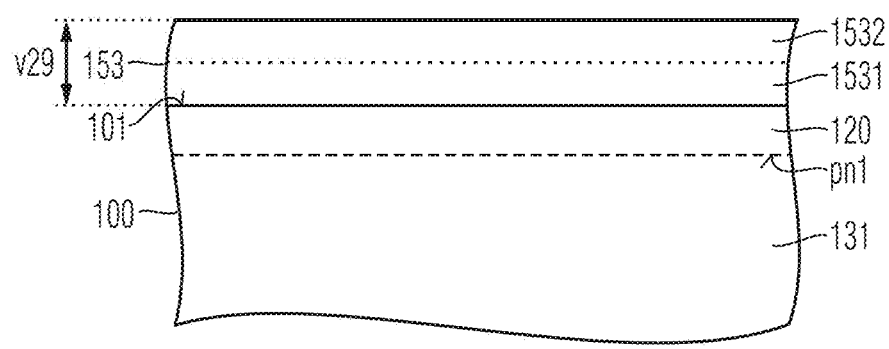
FIG. 6C is a schematic vertical cross-sectional view of the semiconductor substrate portion of FIG. 6B, after forming a second portion of a silicon oxide layer from the second silicon nitride layer.

FIG. 6C shows a silicon oxide layer 153 including the first portion 1531 obtained from a first oxygen radical oxidation and the second portion 1532 obtained from a second oxygen radical oxidation. A vertical thickness v29 of the silicon oxide layer 153 may be at least 30 nm, e.g., at least 40 nm. The process may be repeated several times. Alternatively, silicon oxide may be deposited onto the silicon oxide layer 153, for example, in a CVD process using Tetra-ethyl-orthosilicate (TEOS) as precursor material.

Figure 7A:
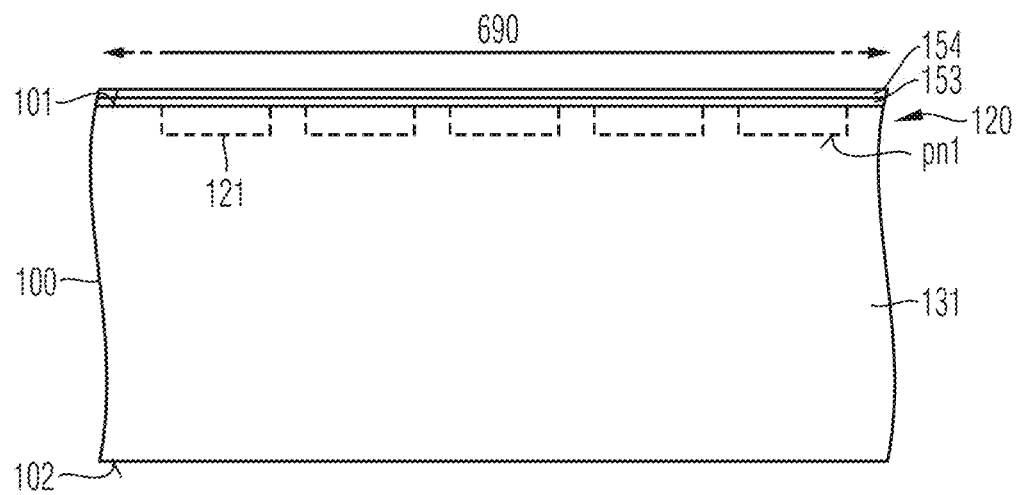
FIG. 7A is a schematic vertical cross-sectional view of a portion of a semiconductor substrate for illustrating a method of manufacturing semiconductor devices with planar gate structures according to an embodiment, after forming a supplementary layer on a silicon oxide layer obtained from a silicon nitride layer.
Figure 7B:
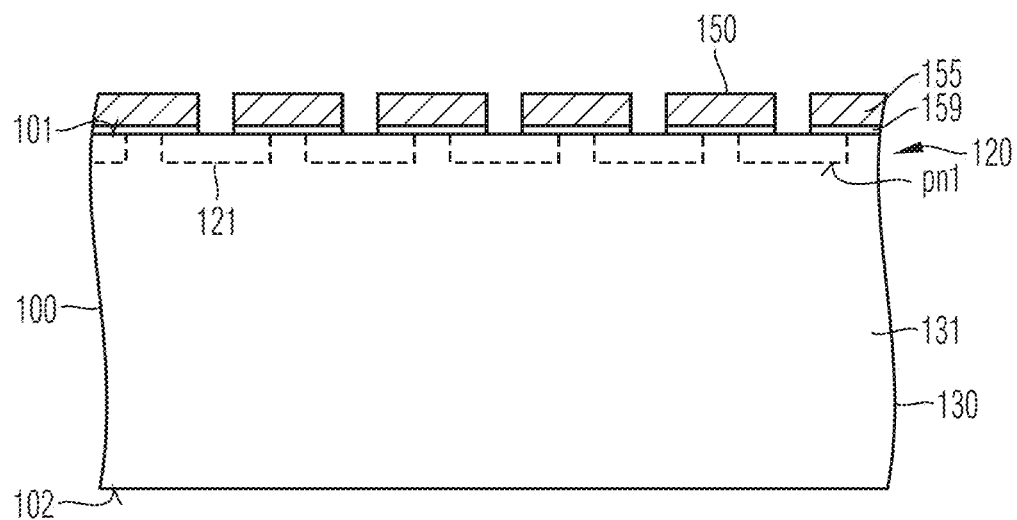
FIG. 7B is a schematic vertical cross-sectional view of the semiconductor substrate portion of FIG. 7A, after forming gate structures.
Figure 7C:
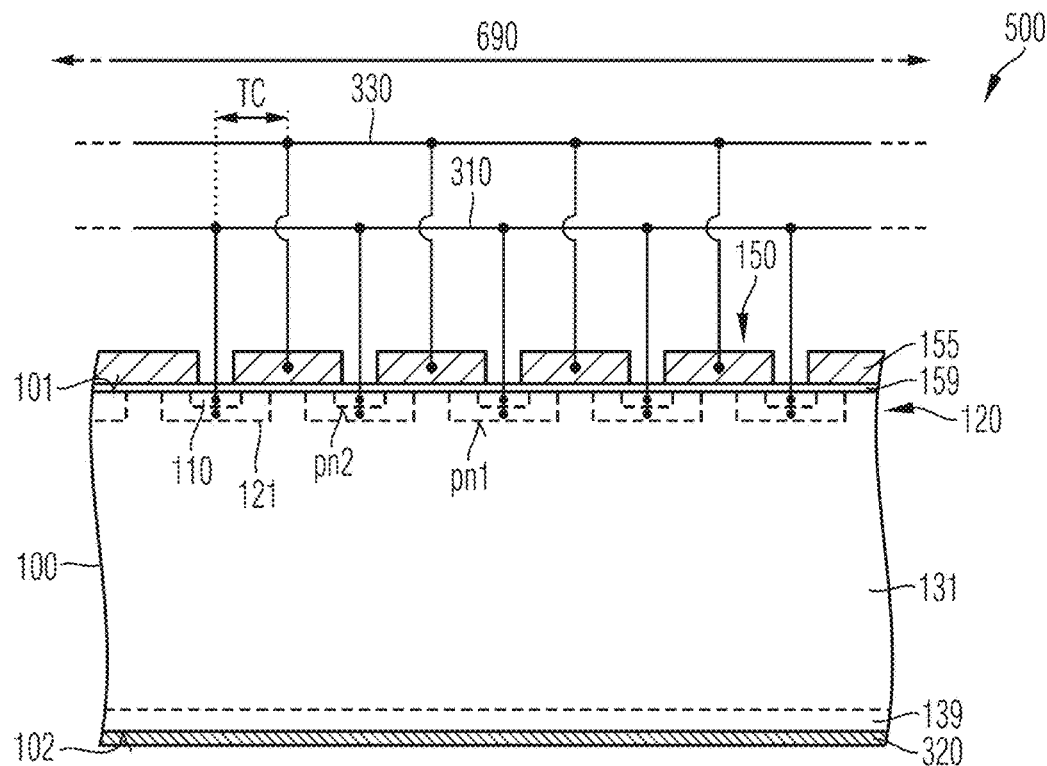
FIG. 7C is a schematic cross-sectional view of the semiconductor substrate portion of FIG. 7B, after forming sources zones and load electrodes.

FIGS. 7A to 7C refer to a method of forming a power semiconductor device with planar gate structures that include a gate dielectric with silicon oxide formed from silicon nitride by oxygen radical oxidation.

A silicon nitride layer is formed, e.g., by LPCVD on a front surface 101 of a semiconductor layer 100 in which a body structure 120 with a plurality of separated body wells 121 per device region 690 forms a first pn junction pn1 with a drift zone 131 formed between the body structure 120 and the rear side surface 102. A silicon oxide layer 153 is formed from the silicon nitride layer by oxygen radical oxidation. Depositing and oxidizing a silicon nitride layer may be repeated one or more times. A dielectric supplementary layer 154 may be deposited on the silicon oxide layer.

FIG. 7A shows the silicon oxide layer 153 and the dielectric supplementary layer 154 formed on the front surface 101. A vertical extension of the silicon oxide layer 153 may be in a range from 15 nm to 120 nm, for example, in a range from 20 nm to 50 nm. The silicon oxide layer 153 contains at least 0.1 at % and at most 2 at % nitrogen. The dielectric supplementary layer 154 may be from silicon oxide with a nitrogen content below 0.01 at %.

One or more conductive materials are deposited on the silicon oxide layer 153. The deposited conductive layer or layer stack, the silicon oxide layer 153, and, if applicable, the supplementary layer 154 are patterned by lithography to form gate structures 150.

FIG. 7B shows the gate structures 150 including a gate electrode 155 from remnant portions of the deposited conductive layer or layer stack as well as a gate dielectric 159 formed from at least the silicon oxide layer 153 and, if applicable, the supplementary layer 154 of FIG. 7A. The gate structures 150 may form stripes extending in a direction orthogonal to the cross-sectional plane, dots or a grid. The gate electrode 155 may include or consist of heavily doped polycrystalline silicon. According to an embodiment, the gate electrode 155 may include a metal-containing layer. The gate dielectric 159 includes a remnant portion of the silicon oxide layer 153 of FIG. 7A and may further include remnants of an intermediate layer of, for example, thermal silicon oxide between the silicon oxide layer 153 and the front surface 101 as well as remnants of the supplementary layer 154 sandwiched between the gate electrode 155 and the remnant portion of the silicon oxide layer 153 of FIG. 7A.

Source zones 110 may be formed between the gate structures 150 and laterally adjusted to them. In each device region 690 a control electrode 330 and a first load electrode 310 are formed at the front side. Along the rear side surface 102 a heavily doped contact structure 139 may be formed in the semiconductor layer 100 and a second load electrode 320 may be formed that directly adjoins the rear side surface 102.

FIG. 7C shows the control electrode 330 electrically connecting separated portions of the gate electrodes 155 in one device region 690 and the first load electrode 310 electrically connected to the source zones 110 and the body structure 120 of a transistor cell field of the device region 690, wherein the transistor cell field includes a plurality of transistor cells TC electrically connected in parallel. The second load electrode 320 forms an ohmic contact with the contact structure 139 along the rear side surface 102.

Figure 7D:
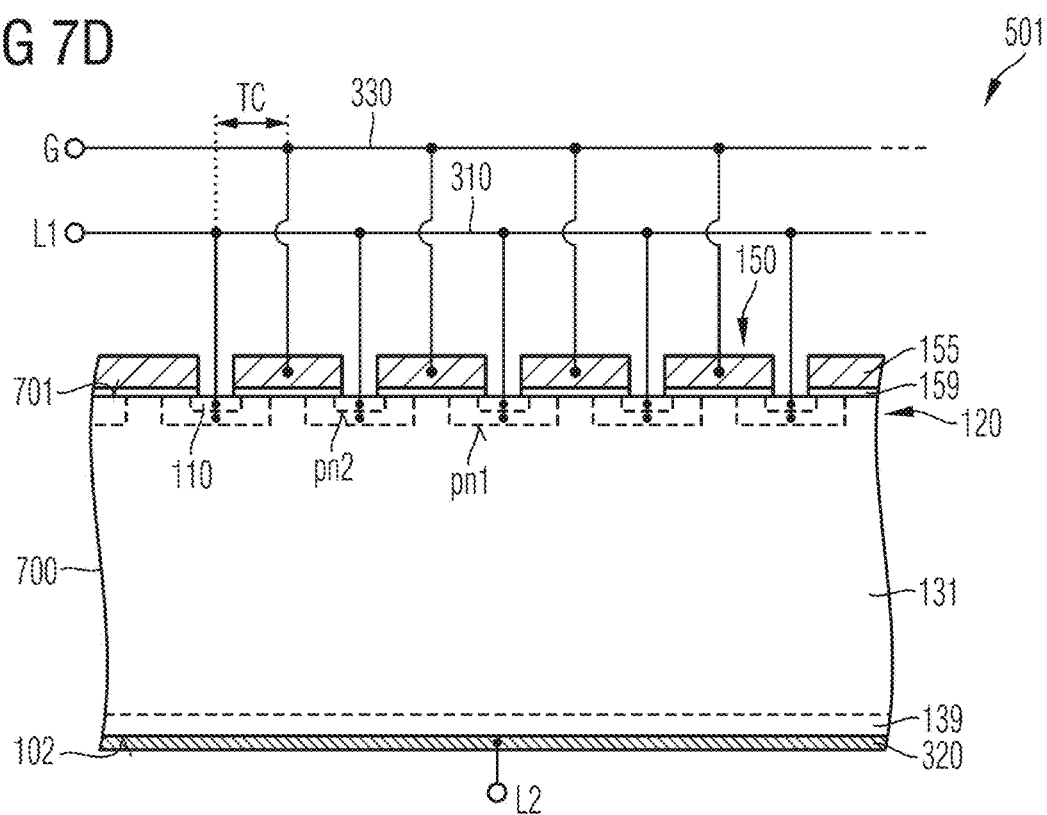
FIG. 7D is a schematic vertical cross-sectional view of a portion of a semiconductor device obtained from the semiconductor substrate of FIG. 7C.

FIG. 7D shows a part of a cross-section of a semiconductor device 501 obtained from the semiconductor substrate 500 of FIG. 7C by dicing along dicing streets in kerf regions separating the device regions 690 from each other.

The semiconductor device 501 includes a semiconductor portion 700 obtained from a portion of the semiconductor layer 100 of FIG. 7C, wherein a first surface 701 of the semiconductor portion 700 corresponds to the front surface 101 and a second surface 702 of the semiconductor portion 700 corresponds to the rear side surface 102 of the semiconductor layer 100 of FIG. 7C.

The control electrode 330 may form or may be electrically connected or coupled to a gate terminal G. The first load electrode 310 may form or may be electrically connected to a first load terminal L1 that may be the source terminal of an insulated gate field effect transistor (IGFET) or the emitter terminal of an insulated gate bipolar transistor (IGBT). The second load electrode 320 may form or may be electrically connected to a second load terminal L2, which may be the drain terminal of an IGFET or the collector terminal of an IGBT.

FIGS. 8A to 8D refer to the formation of power semiconductor devices based on trench gate structures 150 by using an embodiment concerning IGFETs.

A body structure 120 may be formed in a device region 690 of a semiconductor layer 100 from, e.g., silicon carbide. Gate trenches 250 are formed that extend from a front surface 101 through the body structure 120 into a drift zone 131 formed from an original portion of the semiconductor layer 100 outside of the body structure 120.

Figure 8A:
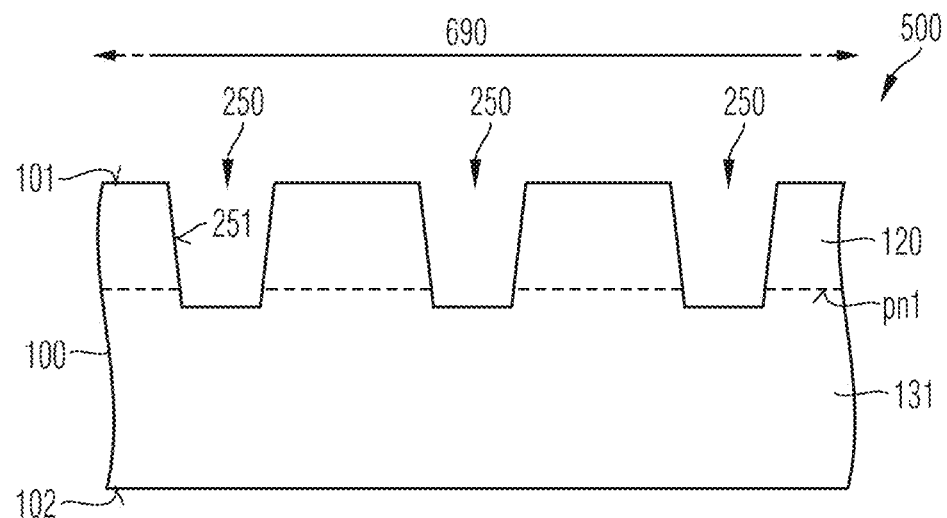
FIG. 8A is a schematic vertical cross-sectional view of a portion of a semiconductor substrate for illustrating a method of manufacturing semiconductor devices with trench gate structures according to an embodiment, after forming gate trenches.

FIG. 8A shows the gate trenches 250 extending from the front surface 101 through the body structure 120 into the drift zone 131. The gate trenches 250 may be stripe-shaped with a longitudinal extension in a direction orthogonal to the cross-sectional plane. At least one of the longitudinal sidewalls of the gate trenches 250 is an active mesa sidewall 191 formed from a main crystal plane with comparatively high charge carrier mobility.

A silicon nitride layer with a thickness of at least 15 nm is deposited and at least a portion of the silicon nitride layer is transformed into a silicon oxide layer 153 by oxygen radical oxidation. Before or after formation of the silicon oxide layer 153, source zones 110 and further doped regions aligned to the gate trenches 250 may be formed by implantation.

Figure 8B:
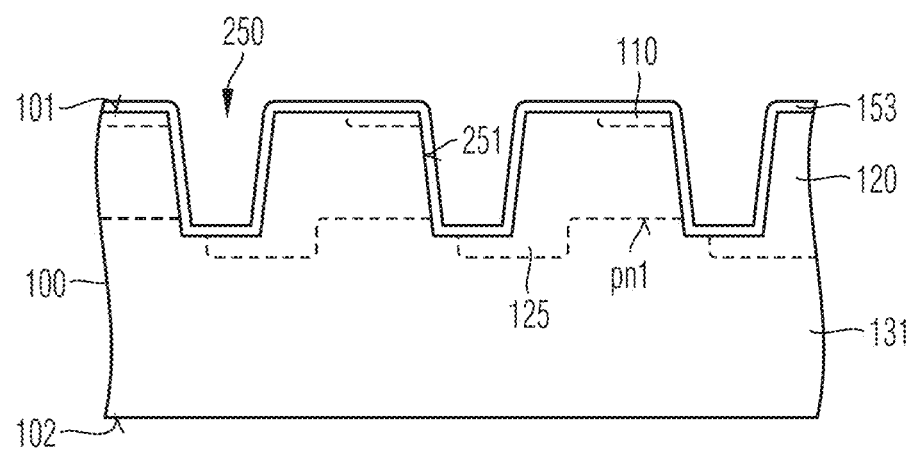
FIG. 8B is a schematic vertical cross-sectional view of the semiconductor substrate portion of FIG. 8A, after forming source zones and shielding regions.

FIG. 8B shows the silicon oxide layer 153 lining at high layer uniformity the front surface 101 and the gate trenches 250 with active mesa sidewalls 191. Source zones 110 along the front surface 101 directly adjoin at least the active mesa sidewalls 191 of the gate trenches 250. A vertical projection of a shielding region 125 between the gate trenches 250 and the rear side surface 102 overlaps with a portion of the trench bottom averted from the active mesa sidewall 191. The shielding regions 125 vertically extend the body structure 120 locally.

A conductive layer or layer stack may be deposited to fill the gate trenches 250. Portions of the deposited conductive materials outside of the gate trenches 250 may be removed. A dielectric layer or layer stack may be deposited and patterned to expose portions of the front surface 101 between neighboring filled gate trenches 250.

Figure 8C:
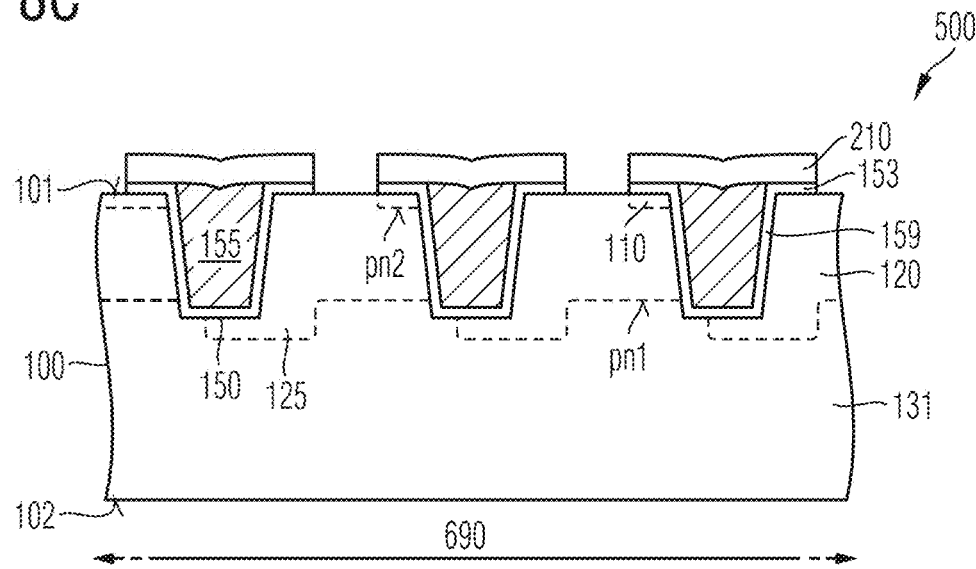
FIG. 8C is a schematic vertical cross-sectional view of the semiconductor substrate portion of FIG. 8B, after forming trench gate structures in the gate trenches.

FIG. 8C shows gate structures 150 including a gate electrode 155 from the conductive material and a gate dielectric 159 from remnant portions of the silicon oxide layer 153 of FIG. 8B. Remnant portions of the dielectric layer or layer stack form an interlayer dielectric 210 covering the recessed gate material in the gate trenches 250 and portions of the silicon oxide layer 153 outside of the gate trenches 250.

A heavily doped contact structure 139 is formed in the semiconductor layer 100 along the rear side surface 102, a control electrode as well as two load electrodes are formed per device region 690 as described with reference to FIG. 7C, and a dicing process obtains a plurality of semiconductor devices from the semiconductor substrate 500.

Figure 8D:
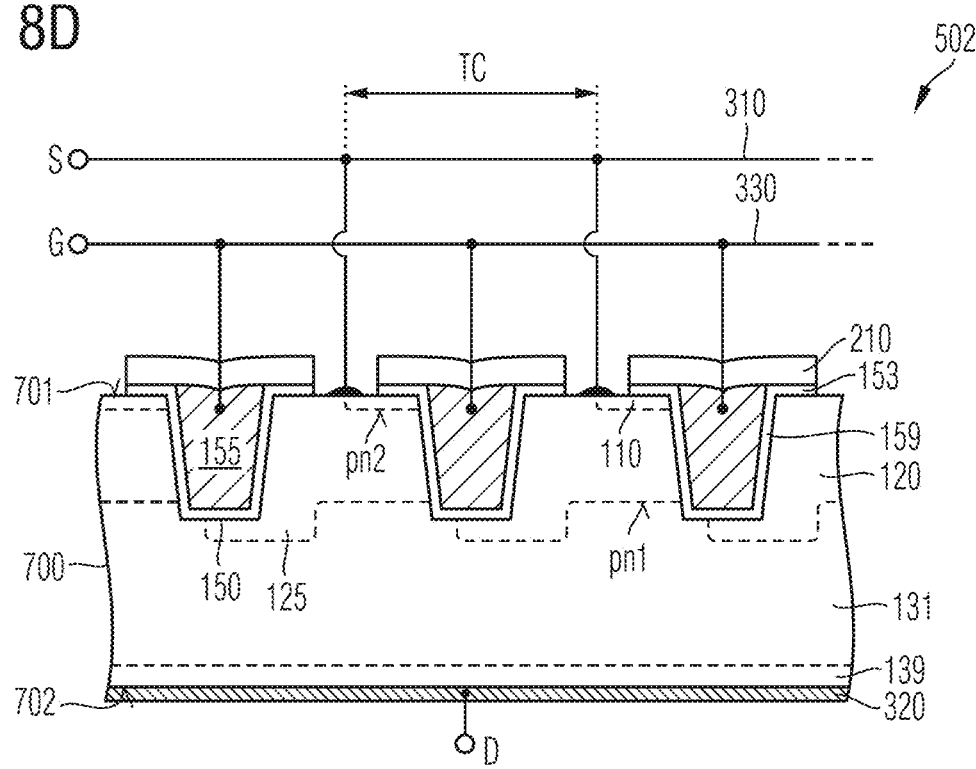
FIG. 8D is a schematic vertical cross-sectional view of a portion of a semiconductor device obtained from the semiconductor substrate of FIG. 8C.

FIG. 8D shows a part of a cross-section of an IGFET 502 obtained by dicing from the semiconductor substrate 500 of FIG. 8C. IGFET 502 includes a semiconductor portion 700 obtained from a portion of the semiconductor layer 100 of FIG. 8C, wherein a first surface 701 of the semiconductor portion 700 corresponds to the front surface 101 and a second surface 702 of the semiconductor portion 700 corresponds to the rear side surface 102 of the semiconductor layer 100 of FIG. 8C.

The control electrode 330 may form or may be electrically connected or coupled to a gate terminal G. The first load electrode 310 may form or may be electrically connected to a source terminal S. The second load electrode 320 may form or may be electrically connected to a drain terminal D. A plurality of transistor cells TC are electrically connected in parallel between source terminal S and drain terminal D.

The following figures concern power semiconductor devices with transistor cells which gate structures 150 include a gate dielectric 159 obtained by one of the above described processes. At least a portion of the gate dielectric 159 contains at least 0.01 at % and at most 2 at % nitrogen.

Figure 9A:
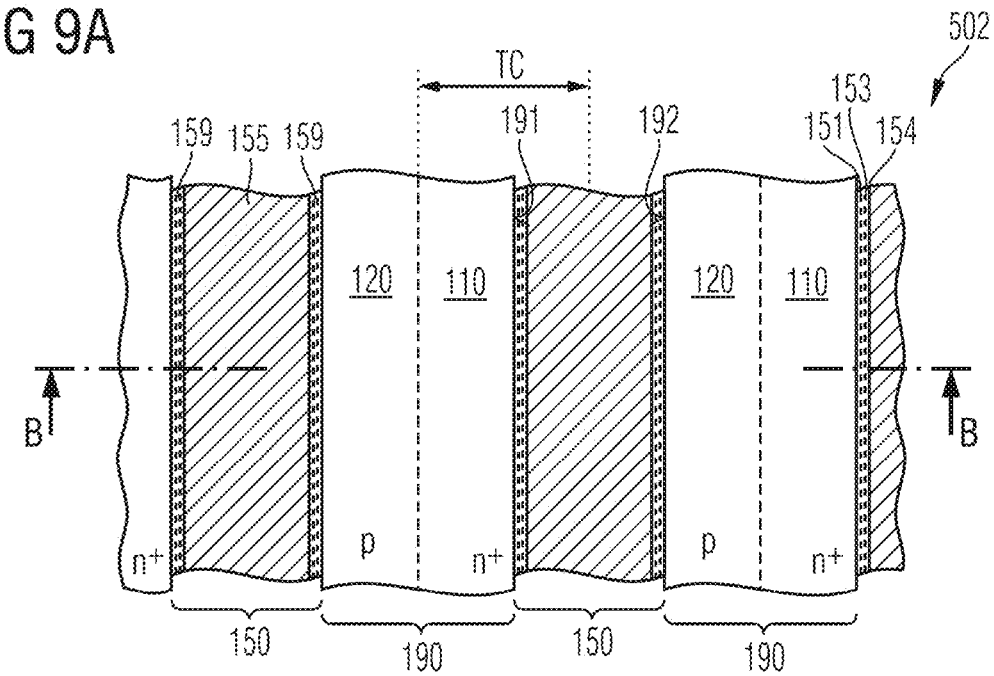
FIG. 9A is a schematic horizontal cross-sectional view of a portion of a power semiconductor device according to an embodiment referring to a silicon carbide insulated gate field effect transistor (SiC-IGFET).
Figure 9B:
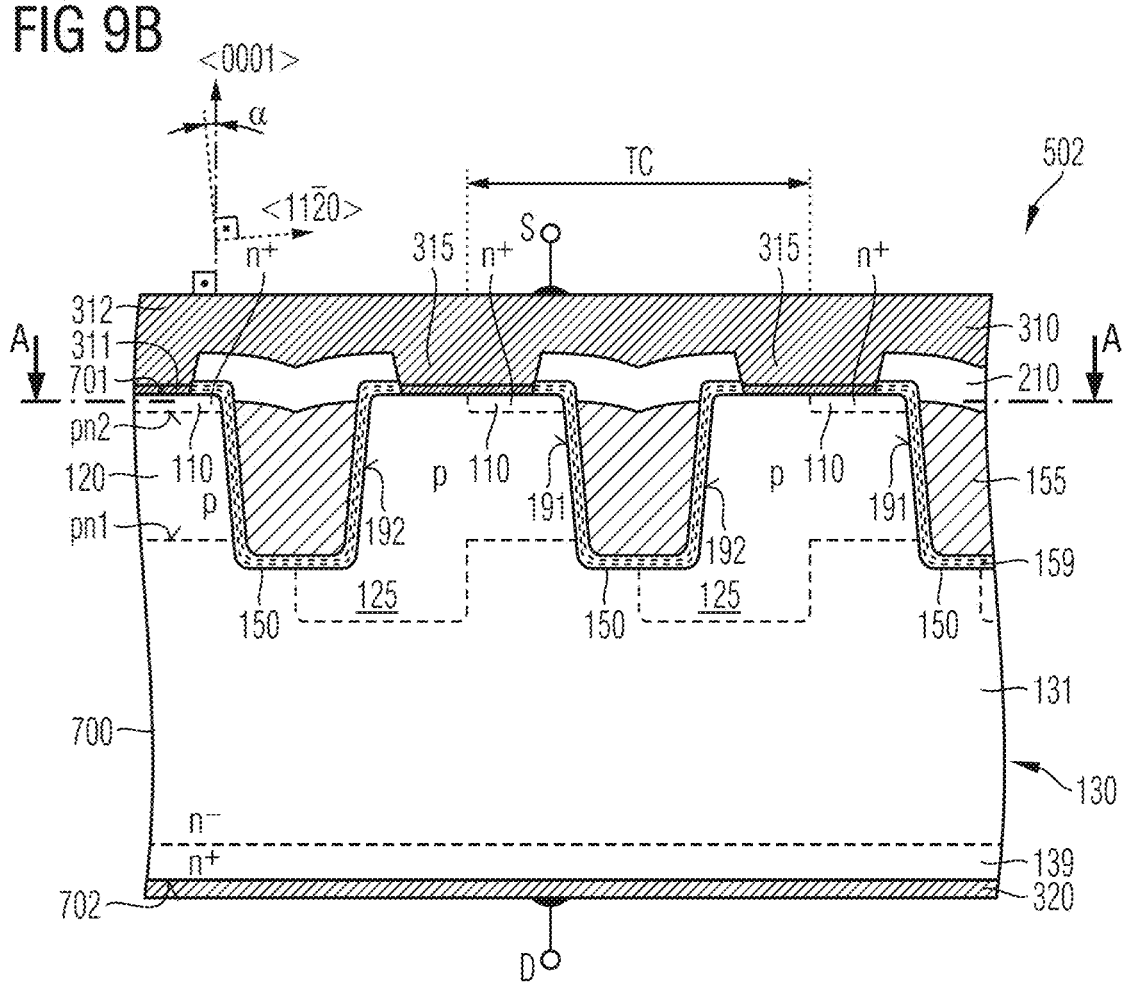
FIG. 9B is a schematic vertical cross-sectional view of the semiconductor device portion of FIG. 9A along line B-B.

FIGS. 9A and 9B refer to an IGFET 502 including transistor cells TC. The IGFET 502 is based on a semiconductor portion 700 that may be from a semiconductor material with a hexagonal crystal lattice, e.g., silicon carbide (SiC) or gallium nitride (GaN). For example, the semiconductor material is 2H—SiC (SiC of the 2H polytype), 6H—SIC or 15R—SiC. According to an embodiment the semiconductor material is silicon carbide of the 4H polytype (4H—SiC).

At a front side the semiconductor portion 700 has a first surface 701 which may include coplanar surface sections. The first surface 701 may coincide with a main crystal plane or may be tilted to a main crystal plane by an off-axis angle α, which absolute value may be at least 2° and at most 12°, e.g., about 4°.

In the illustrated embodiment, the <0001> crystal axis is tilted at an off-axis angle α>0 to the normal and the <11-20> crystal axis is tilted at the off-axis angle α with respect to a horizontal plane. The <1-100> crystal axis is orthogonal to the cross-sectional plane.

The first surface 701 may be serrated with parallel first surface sections shifted to each other and tilted to a horizontal plane by the off-axis angle α as well as second surface sections tilted to the first surface sections and connecting the first surface sections such that a cross-sectional line of the serrated first surface 701 approximates a saw-tooth line.

On the back of the semiconductor portion 700 an opposite second surface 702 may extend parallel to the first surface 701. A distance between the first surface 701 at the front and a second surface 702 on the back is related to a nominal blocking capability of the IGFET 502. A total thickness of the semiconductor portion 700 between the first and second surfaces 701, 702 may be in the range of several hundred nm or several μm to several hundred μm. The normal to a mean plane of the first surface 701 defines a vertical direction and directions parallel to the first surface 701 are horizontal directions.

The transistor cells TC are formed at the front along the first surface 701. A drift structure 130 separates the transistor cells TC from the second surface 702 on the back. The drift structure 130 may include a heavily doped contact structure 139 directly adjoining the second surface 702 and a lightly doped drift zone 131 between the transistor cells TC and the heavily doped contact structure 139.

The heavily doped contact structure 139 may be or may include a substrate portion obtained from a crystalline ingot and forms an ohmic contact with a second load electrode 320 that directly adjoins the second surface 702. A mean dopant concentration in the contact structure 139 is sufficiently high to ensure an ohmic contact with the second load electrode 320.

The drift zone 131 may be formed in a layer grown by epitaxy on the contact structure 139. A mean net dopant concentration in the drift zone 131 may be in the range from $1E15$ cm$^{-3}$ to $5E16$ cm$^{-3}$ in case the semiconductor portion 700 is from silicon carbide. The drift structure 130 may include further doped regions, for example field stop zones, barrier zones and/or current spread zones of the conductivity type of the drift zone 131, or counter-doped regions.

The drift zone 131 may directly adjoin the contact structure 139 or a buffer layer forming a unipolar junction with the drift zone 131 may be sandwiched between the drift zone 131 and the contact structure 139, wherein a vertical extension of the buffer layer may be approximately 1 μm and a mean dopant concentration in the buffer layer may be in a range from 3E17 cm$^{-3}$ to 1E18 cm$^{-3}$, by way of example. The buffer layer may contribute to shaping the electric field gradient in the drift structure 130.

The transistor cells TC are oriented along trench gate structures 150 that extend from the first surface 701 into the semiconductor portion 700 such that mesa portions 190 of the semiconductor portion 700 separate neighboring trench gate structures 150.

A longitudinal extension of the trench gate structures 150 along a first horizontal direction is greater than a transverse extension along a second horizontal direction orthogonal to the first horizontal direction. The trench gate structures 150 may be long stripes extending from one side of a transistor cell region to an opposite side, wherein the length of the trench gate structures 150 may be up to several millimeters. According to other embodiments a plurality of separated trench gate structures 150 may be formed along a line extending from one side of the transistor cell region to the opposite side, or the trench gate structures 150 may form a grid with the mesa portions 190 formed in the meshes of the grid.

At the bottom, the trench gate structures 150 may be rounded, wherein a radius of the curvature may be at least twice the thickness of a gate dielectric 159 described in the following.

The trench gate structures 150 may be equally spaced, may have approximately equal width, and may form a regular pattern, wherein a pitch (center-to-center distance) of the trench gate structures 150 may be in a range from 1 µm to 10 µm, e.g., from 1.5 µm to 5 µm. A vertical extension of the trench gate structures 150 may be in a range from 0.3 µm to 5 µm, e.g., in a range from 0.5 µm to 2 µm.

The trench gate structures 150 may be vertical to the first surface 701 or may taper with increasing distance to the first surface 701. For example, a taper angle of the trench gate structures 150 with respect to the vertical direction may be equal to the off-axis angle or may deviate from the off-axis angle by not more than ±1 degree such that at least a first, active mesa sidewall 191 of two opposite longitudinal mesa sidewalls 191, 192 is formed by a main crystal plane with high charge carrier mobility, e.g., a {11–20} crystal plane. A second, passive mesa sidewall 192 opposite to the first, active mesa sidewall 191 may be tilted to a main crystal plane by twice the off-axis angle α, e.g., by 4 degree or more, for example, by about 8 degree. The first, active mesa sidewall 191 and the second, passive mesa sidewall 192 are on opposite longitudinal sides of the intermediate mesa portion 190 and directly adjoin two different, neighboring trench gate structures 150.

The trench gate structures 150 include a conductive gate electrode 155 which may include or consist of a heavily doped polycrystalline silicon layer and/or a metal-containing layer. The gate electrode 155 may be electrically connected to a gate metallization that forms or that is electrically connected or coupled to a gate terminal.

The trench gate structures 150 further include a gate dielectric 159 separating the gate electrode 155 from the semiconductor portion 700 along at least the first, active mesa sidewall 191.

The gate dielectric 159 includes or consists of a silicon oxide layer 153 that may be obtained from one of the above described methods and that contains 0.01 at % to 2 at % nitrogen. The gate dielectric 159 may include a dielectric intermediate layer 151 without traps, e.g., from silicon oxide containing nitrogen only as unwanted impurity and a thickness of at least 3 nm, e.g., at least 5 nm, or at least 10 nm and at most 20 nm sandwiched between body structure 120 and the silicon oxide layer 153 containing nitrogen. Alternatively of in addition, the gate dielectric 159 may include a dielectric supplementary layer 154 between the silicon oxide layer 153 containing nitrogen and the gate electrode 155. The supplementary layer 154 may be from silicon oxide with a nitrogen content less than 0.01 atomic percent.

The trench gate structures 150 may exclusively include the gate electrode 155 and the gate dielectric 159 or may include further conductive and/or dielectric structures in addition to the gate electrode 155 and the gate dielectric 159, e.g., compensation or contact structures.

The mesa portions 190 include source zones 110 that are oriented to the front side. The source zones 110 may directly adjoin the first surface 701 and directly adjoin at least the first, active mesa sidewall 191 of the respective mesa portion 190.

The mesa portions 190 further include a body structure 120 that separates the source zones 110 from the drift structure 130. The body structure 120 forms first pn junctions pn1 with the drift structure 130 and second pn junctions pn2 with the source zones 110. First portions of the body structure 120 directly adjoin the first, active mesa sidewalls 191 and second portions of the body structure 120 directly adjoin the second, passive mesa sidewalls 192, wherein a dopant concentration in the second portions may exceed the dopant concentration in the first portions. The body structure 120 may include shielding regions 125 locally increasing the vertical extension of the body structure 120 and overlapping a portion of the trench gate structures 150 oriented to the second, passive mesa sidewalls 192.

A minimum vertical extension of the body structure 120 corresponds to a channel length of the transistor cells TC and may be in a range from 0.2 µm to 1.5 µm.

An interlayer dielectric 210 that may include one or more dielectric layers from silicon oxide, silicon nitride, silicon oxynitride, doped or undoped silicon glass, for example BSG (boron silicate glass), PSG (phosphorus silicate glass) or BPSG (boron phosphorus silicate glass) separates the gate electrode 155 from a first load electrode 310. First contact structures 315 extend through the interlayer dielectric 210 and electrically connect the first load electrode 310 with the body structure 120 and the source zones 110.

The first load electrode 310 may form or may be electrically connected to a source terminal S. A second load electrode 320 directly adjoining the second surface 702 may form or may be electrically connected or coupled to a drain terminal D.

According to an embodiment, the transistor cells TC are n-channel FET cells with p-doped body structure 120, n-doped source zones 110 and n-doped drift zone 131. According to another embodiment, the transistor cells TC are p-channel FET cells with n-doped body structure 120, p-doped source zones 110 and p-doped drift zone 131.

The gate dielectric 159 capacitively couples portions of the body structure 120 with the gate electrode 155. When a potential at the gate electrode 155 exceeds or falls below a threshold voltage of the IGFET 502, the electric field effects that the minority charge carriers in the body structure 120 form inversion channels along the gate dielectric 159, wherein the inversion channels connect the source zones 110 with the drift structure 130, thereby turning on the IGFET 502. In the on-state, a load current flows through the semiconductor portion 700 approximately along the first, active mesa sidewalls 191 between the first and second load electrodes 310, 320.

The nitrogen atoms and/or molecules contained in the gate dielectric 159 positively affect gate dielectric integrity and electron mobility in the MOS channel. In addition, the intrinsic nitrogen atoms effectively trap electrons generated by cosmic radiation and may increase the intrinsic electron-hole recombination rate in the gate dielectric 159.

FIG. 10 refers to another type of IGFETs 502 with a semiconductor portion 700 from Si, Ge, SiGe, SiC or an $A_{III}B_V$ semiconductor as described above.

The semiconductor portion 700 includes a drift structure 130 including a drift zone 131 forming a first pn junction pn1 with a body structure 120, a heavily doped contact structure 139 directly adjoining the second surface 702 and a field stop layer 138 sandwiched between the drift zone 131 and the contact structure 139, wherein a mean dopant concentration in the field stop layer 138 is at least twice a mean dopant concentration in the drift zone 131 and at most one tenth of the maximum dopant concentration in the contact structure 139.

Trench gate structures 150 extending from the first surface 701 into the semiconductor portion 700 include a gate electrode 155 in top portions oriented to the first surface 701 and a field electrode 165 in bottom portions oriented to the second surface 702. A thick field dielectric 169 separates the field electrode 165 from the surrounding semiconductor material of the semiconductor portion 700. A separation dielectric 156 separates the gate electrode 155 from the field electrode 165. The field electrode 165 may be electrically connected to the first load electrode 310. The field dielectric 169 may be formed from at least one of a thermally grown silicon oxide layer, a silicon nitride layer or a deposited silicon oxide layer.

A thin gate dielectric 159 that includes a silicon oxide layer obtained, e.g., by oxygen radical oxidation from a silicon nitride layer and containing 0.01 at % to 2 at % nitrogen separates the gate electrode 155 from the body structure 120. In addition, the gate dielectric 159 may include at least one of a dielectric intermediate layer 151 and a dielectric supplementary layer 154 as described with reference to FIGS. 9A and 9B.

In mesa portions of the semiconductor portion 700 between the trench gate structures 150 doped source zones 110 forming second pn junctions pn2 with the body structure 120 may directly adjoin the first surface 701. The body structure 120 separates the source zones 110 from the drift zone 131.

FIG. 11 refers to an IGBT 503 with a contact structure 139 forming a third pn junction pn3 with the drift zone 131 or with the field stop layer 138. In addition to trench gate structures 150, auxiliary trench structures 160 may extend from the first surface 701 into the drift zone 131, wherein the auxiliary trench structures 160 are devoid of portions of the gate electrode 155. In addition of active mesa portions 190 through which a load current flows in an on-state, the semiconductor portion 700 may include passive mesa portions 195 not contributing to a load current flow in the on-state.

The first load electrode 310 may form or may be electrically connected to an emitter terminal E. The second load electrode 320 directly adjoining the second surface 702 may form or may be electrically connected or coupled to a collector terminal C. The IGBT 503 may be a reverse blocking IGBT with a homogenously doped contact structure 139 or a reverse conducting IGBT with the contact structure 139 including complementarily doped zones alternating along at least one horizontal direction.

At least the trench gate structures 150 or the auxiliary trench structures 160 include a thin gate dielectric 159 consisting of or including a silicon oxide layer 153 obtained, e.g., by oxygen radical oxidation from a silicon nitride layer and containing 0.01 at % to 2 at % nitrogen.

FIG. 12 is a flow diagram illustrating a process 1200 for forming silicon oxide (e.g., for forming a gate oxide) on a semiconductor material (e.g., a semiconductor layer) in accordance with one or more embodiments provided herein. The semiconductor material may be based on silicon carbide or another material provided herein. Specifically, FIG. 12 shows an in-situ cyclic process of LPCVD nitride deposition and reoxidation. The process of forming a high-quality deposited oxide consists of repeated deposition of silicon nitride by LPCVD and a following reoxidation of this silicon nitride film which converts it into silicon oxide. By varying the number of repetitive cycles or iterations, the final oxide thickness can be tuned. Both sub-processes, the LPCVD silicon nitride deposition, and the radical reoxidation are performed at elevated temperatures (750-900° C.) and low pressure conditions (200-1000 mTorr).

While it would be possible to run the sub-processes ex-situ in separate reactors, this approach would be unpractical in volume manufacturing. Each low-pressure/high-temperature process would consist of a relative short deposition respectively reoxidation process (1-10 min), but with very time consuming process overhead of substrate loading, heat-up, pump-down, cooling and reactor backfill (typically 100-300 min).

By performing the repetitive sub-processes in-situ in one chamber, the extensive overhead is only done once and the overall process time does not scale with the final oxide thickness. Depending on the deposition and reoxidation details, second-order adjustments of temperature and/or pressure could be made without major impact on the overall process time. FIG. 12 shows the flow diagram that includes the in-situ cyclic process performed on a semiconductor material, such as a semiconductor layer 100, which may be a semiconductor wafer, as described above.

The process 1200 includes loading of semiconductor material (e.g., silicon) into a reaction chamber (operation 1205), pumping down and heating up to the process temperature and pressure inside the reaction chamber (operation 1210), performing radical oxidation of the silicon material (operation 1215), adjusting the temperature and/or pressure, for example, based on a feedback parameter (operation 1220), depositing silicon nitride (operation 1225), adjusting the temperature and/or pressure, for example, based on a feedback parameter (operation 1230), and preforming a radical reoxidation of the silicon nitride (operation 1235). After operation 1235 is performed, another iteration of the process loop may be performed LPCVD nitride deposition and reoxidation (operation 1240). The process of forming a high-quality deposited oxide consists of repeated deposition of silicon nitride by LPCVD and a following reoxidation of this silicon nitride film which converts it into silicon oxide. By varying the number of repetitive cycles or iterations and the thicknesses of the single silicon nitride layers, the final oxide thickness can be tuned. As shown, operations 1215, 1220, 1230, and 1240 may be optional.

On the condition that the oxide is at the desired thickness, the process 1200 may proceed from operation 1235 to operation 1245, during which the process chamber is cooled down and backfilled. Lastly, the process 1200 includes unloading the material from the process chamber (operation 1250).

In order to form a reliable gate oxide, thermally grown oxides or deposited oxides plus an anneal are used in various semiconductor devices. If the device, e.g., a power semiconductor, consists of a trench cell, another requirement would be the conformal fill of this trench. TEOS chemical vapor deposition (CVD) processes can be used to fill a trench with high conformity. However, the TEOS usually has a bad within wafer uniformity. Moreover, the TEOS needs to be annealed at high temperatures (>1000° C.) for a long time (scale of hours) in order to improve the quality towards those of a thermally grown oxide. Too high thermal budget on the other hand increases the diffusion of already implanted dopants and can lead to segregation. Thus, it is required for high voltage devices to minimize the thermal budget. Radical reoxidation of deposited silicon nitride has a much lower thermal budget compared to a TEOS followed by an anneal, and thus reduces the overall thermal budget for the device.

The LPCVD silicon nitride process is typically performed at temperatures ranging from 700-800° C. at process pressures of 100-500 mTorr in a mixture of dichlorosilane (DCS, $SiCl_2H_2$) and ammonia ($NH_3$) in a ratio of 1:4-1:10. Typical deposition rates are in the order of single nm/min.

Figure 13:
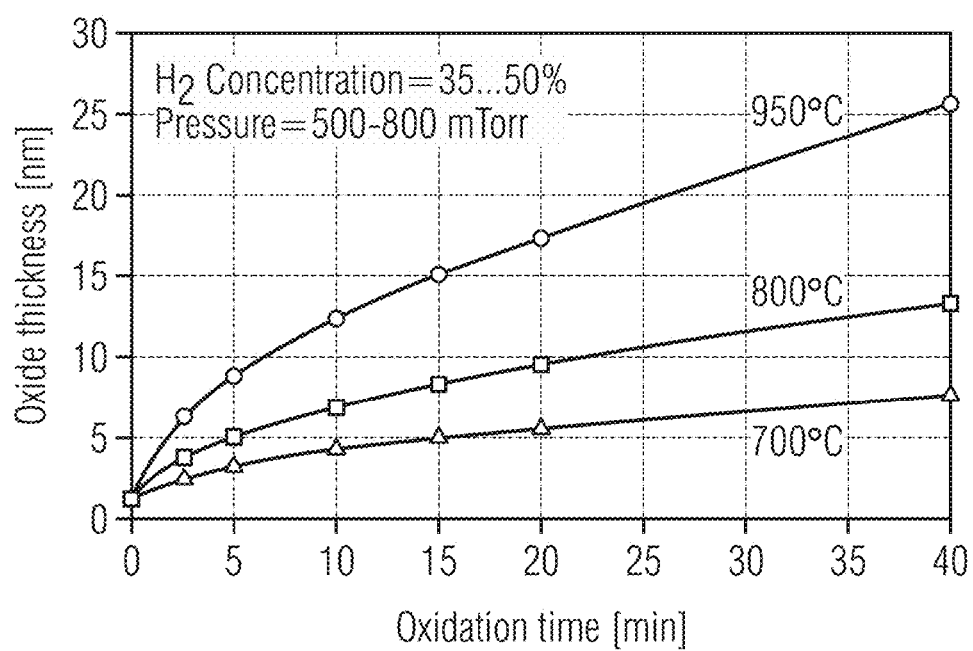
FIG. 13 shows examples of achievable oxide thicknesses vs. oxidation times at different process temperatures according to one or more embodiments.

The radical oxidation process runs at a temperature of 700-900° C. at pressures below 1000 mTorr. The process gas consists in a mixture of 5-50% hydrogen $H_2$ in oxygen $O_2$. Depending of the process conditions up to 20 nm $SiO_2$ could be grown on silicon. FIG. 13 shows examples of achievable oxide thicknesses vs. oxidation times at different process temperatures according to one or more embodiments provided herein. The reoxidation rate of silicon nitride $Si_3N_4$ is only approximately 70% of the silicon oxidation rate, i.e., 7 nm $SiO_2$ is grown on $Si_3N_4$ when 10 nm SiO2 is grown on silicon.

Figure 14:
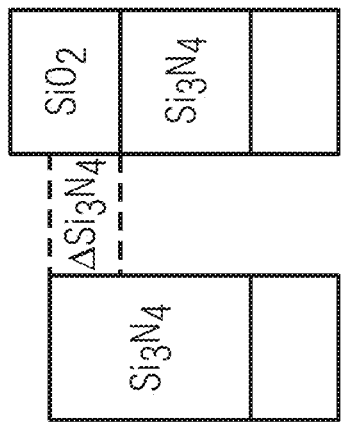
FIG. 14 shows a cross-sectional view of a micrograph of a thick silicon oxide in high AR trenches.

In contrast to a LPCVD deposition, this is in every case a condensation, i.e., a solidifaction of precursors delivered by the gas phase, in an oxidation process only the oxidizer is originated by the gas phase, while the material to be oxidized (e.g. silicon or silicon nitride) is delivered by the solid substrate. Therefore an amount of the substrate is consumed by the oxide. In the case of the oxidation of silicon, 46% of the final oxide thickness is consumed from the silicon. While for the silicon oxidation this value is well established, for the reoxidation of silicon nitride the consumption can be calculated by some fundamental numbers and the assumption, that the number of silicon atoms in the film is constant. Additional to this assumption only the relative atomic masses of silicon, oxygen and nitrogen are needed as well as the densities of silicon oxide and nitride. By considering the stoichiometry of $SiO_2$ and $Si_3N_4$ and relating it to the densities of these materials, the thickness ratio is found to be approx. 60%, i.e. for 10 nm $SiO_2$ formed by reoxidation, 6 nm of $Si_3N_4$ is consumed. FIG. 14 shows the equation and a schematic of the film stack. In particular, FIG. 14 shows a cross-sectional view of a micrograph of a thick silicon oxide in high AR trenches.

Depending on the technological requirements the LPCVD silicon nitride deposition thickness and the reoxidation thickness must be chosen. If the nitride deposition thickness is larger than the consumed nitride during the reoxidation, a nitride (N)-oxide stack (O) is formed in each cycle, resulting in a multiple stack structure: O—N—O— . . . —N—O. While such stack might be desirable for certain applications, if a homogeneous pure silicon oxide is needed, the consumed nitride thickness must exceed the deposited nitride thickness. By carefully selecting the process conditions the required film properties can be adjusted.

Thus, according to one or more embodiments provided herein, an in-situ method of manufacturing includes formation of a silicon based dielectric by sequential deposition of silicon nitride and radical reoxidation. According, no wafer transport to another tool or chamber is necessary during described sequence (in-situ). Furthermore, the silicon nitride deposition and the radical oxidation run at the same temperature and/or pressure. In addition, the processes are performed on a multiple-wafer set-up, instead of a single-wafer arrangement. The process may be used in power technologies like low or medium voltage (10 V-400 V nominal voltage) silicon trench power devices, and other trench power devices, as well as planar power devices.

In addition, according to one or more embodiments provided herein, a manufacturing system is provided. The manufacturing system includes a process chamber configured for a combination of low-pressure chemical vapor deposition of silicon nitride and a reoxidation by in-situ steam generation (ISSG). The manufacturing system further includes a means of optical in-situ control of the reoxidation process via refraction at the interface $Si_3N_4/SiO_2$ (e.g. measurement window).

In view of the above, a standard TEOS gate oxide for trench-based power devices is replaced by a reoxidized nitride. The reoxidized nitrides have superior structural properties compared to TEOS. To avoid big process overhead time, all processes (deposition of the silicon nitride and the following reoxidation by ISSG) are performed in-situ in the same chamber.

Moreover, a high temperature and long densification anneal is not required, and thus the power device process benefits from a reduced thermal budget.

Figure 15:
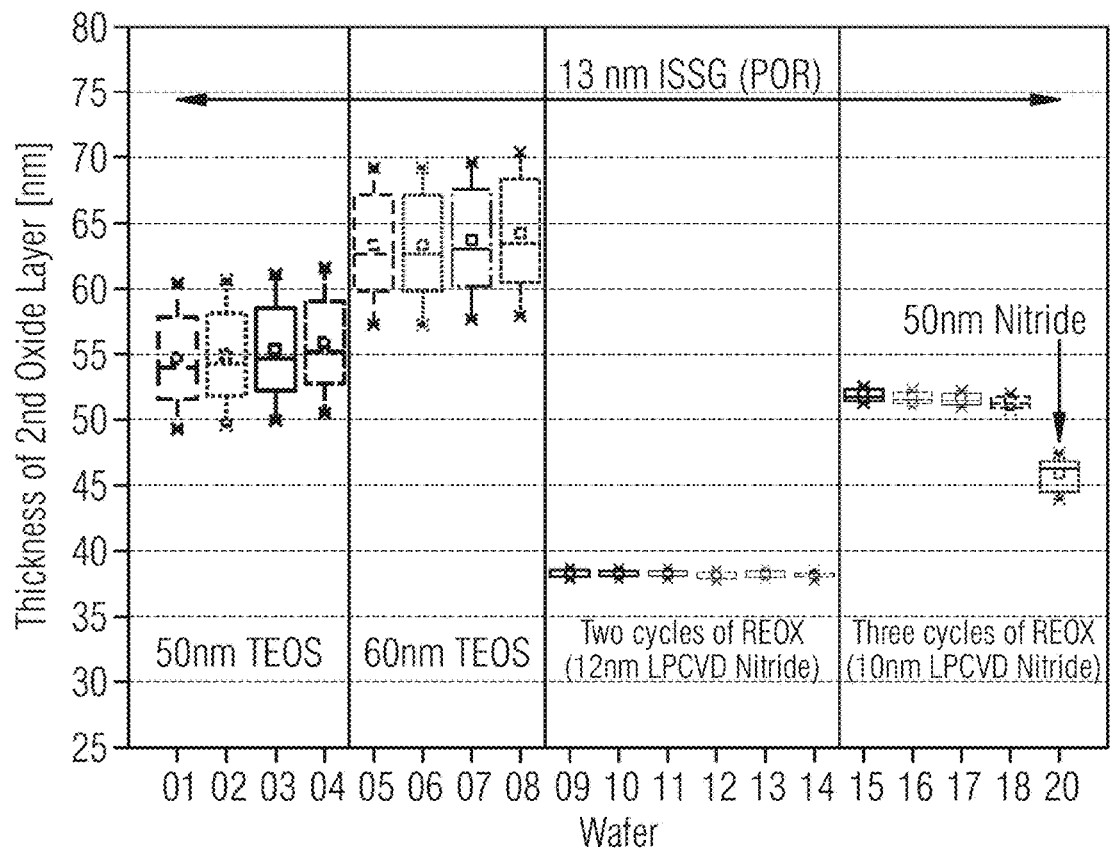
FIG. 15 shows the variation of the gate oxide thickness over a wafer using TEOS and REOX films.

FIG. 15 shows the variation of the gate oxide thickness over a wafer using TEOS and REOX films. Table 1 refers to wafers used in the different processes to illustrate gate oxide thickness variation of TEOS and REOX films.

TABLE 1

| Wafer | Average Thickness d (nm) | Range (%) | Standard deviation σ (%) |
|---|---|---|---|
| 1-4 | 55.1 | 20.6 | 7.2 |
| 5-8 | 63.5 | 18.9 | 6.9 |
| 9-14 | 38.2 | 1.8 | 0.6 |
| 15-19 | 51.6 | 2.3 | 0.8 |

The films were deposited in two steps. First, a thin interface was formed by in-situ steam generation (ISSG), then a thicker layer of TEOS or REOX oxide is deposited on top, respectively. Wafer 1-8 have 40 and 50 nm of TEOS as the second oxide layer. On the wafer 9-14, two cycles of depositing 12 nm LPCVD nitride and the reoxidation with ISSG were performed. For wafer 15-18, three cycles with 10 nm nitride are performed. The thickness of the oxide films was measured with spectral ellipsometry on planar surfaces. FIG. 15 only shows the thickness of the second oxide layer. The boxes consist of nine measurement points across one wafer. The reoxidized nitride films show a much smaller within-wafer variation (σ=0.7%) compared to films that were deposited with TEOS (σ=7.1%).

Figure 16:
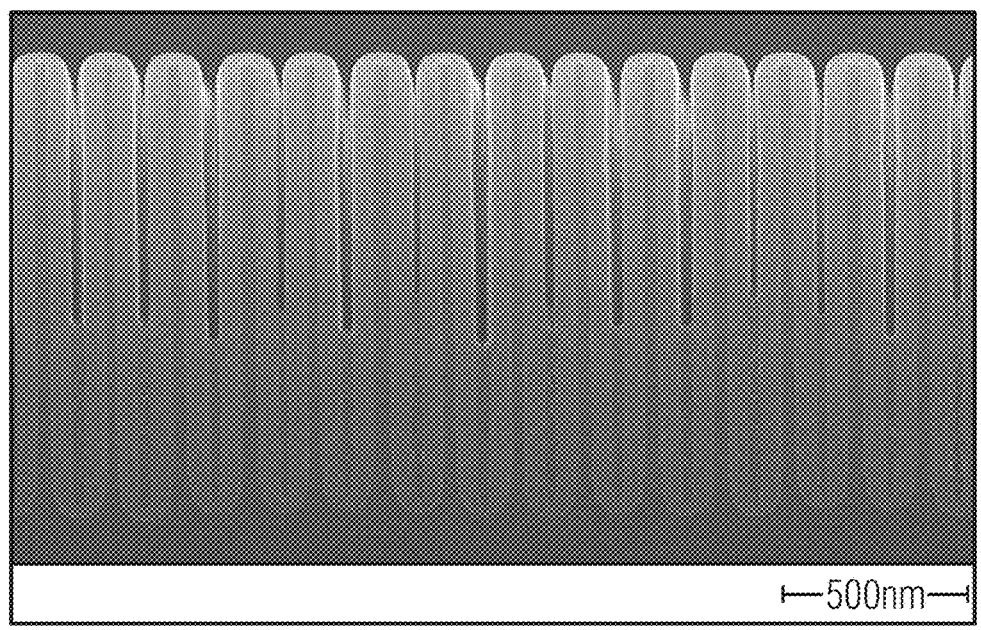
FIG. 16 is a cross-section micrograph of a thick silicon oxide in high-AR trenches.

FIG. 16 is a cross-section micrograph of a thick silicon oxide in high-AR trenches. Specifically, FIG. 16 shows high-aspect-ratio trenches (12:1) with a silicon oxide of approximately 50 nm deposited by a radical oxidation of the silicon (20 nm) followed two cycle of REOX (LPCVD of silicon nitride and radical reoxidation). This micrograph shows the excellent conformality of the oxide, i.e., the uniform sidewall thickness from top to bottom of the trenches. The silicon consumption of this sequence was only 10 nm for the first 20 nm of radical oxide. A conventional thermally grown silicon oxide of the same thickness would have consumed 25 nm of silicon, i.e., 2.5 times as much. By further reduction of the thickness grown by the initial radical oxidation of silicon the consumption could be reduced even further.

A MOSFET structure with high gate area was used to investigate the reliability and gate leakage. During the fast wafer level reliability test (fWLR), the MOSFET are repetitively stressed with an increasing voltage followed by the measurement of the current at operation voltage (ramped voltage stress measurement).

Figure 17:
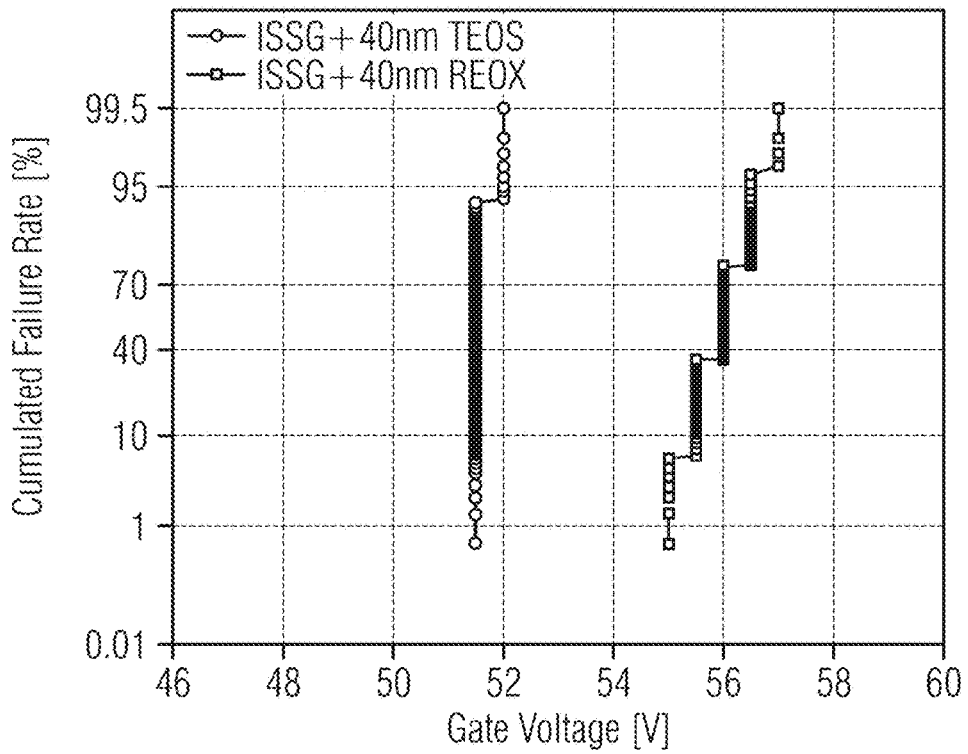
FIG. 17 illustrates a cumulated failure rate of planar MOSFETs with TEOS and REOX gate oxides, respectively.

FIG. 17 illustrates a cumulated failure rate of planar MOSFETs with TEOS and REOX gate oxides, respectively. Fast WLR test of MOSFETs with TEOS and REOX gate oxides have demonstrated, that the reoxidized nitride is performing better in terms of reliability than TEOS oxides. A failure rate of 63.2% (Weibull function equals 0) occurs at 51.5V for the TEOS oxide and at 56V for the REOX oxide.

Figure 18:
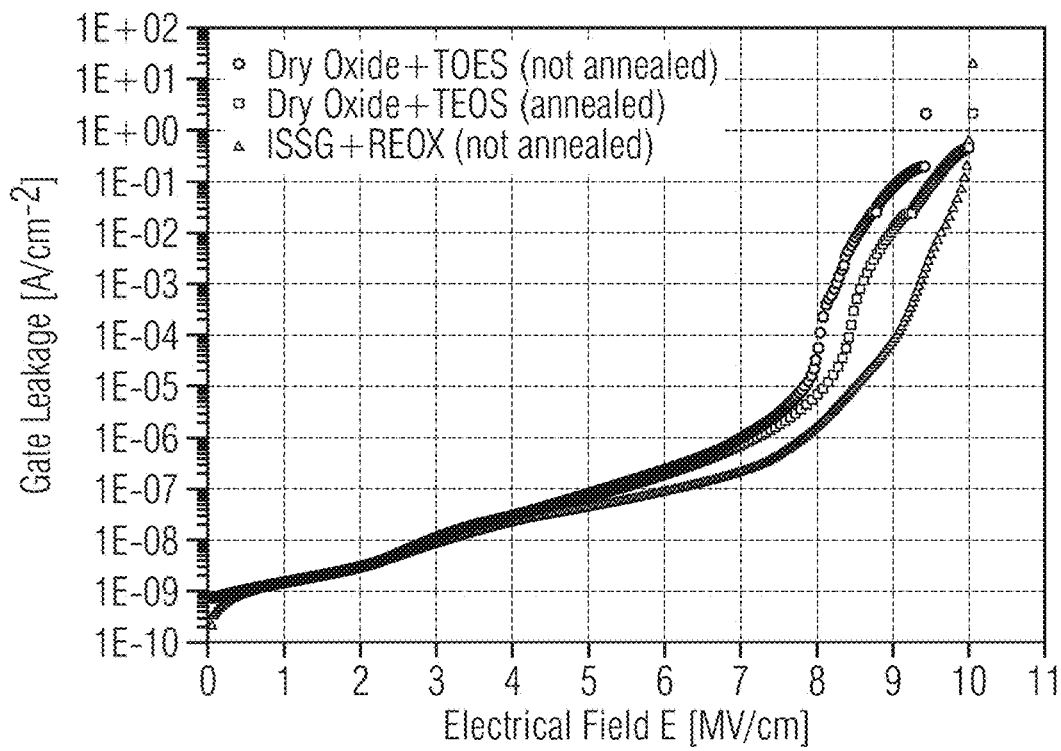
FIG. 18 illustrates an I-V characteristic of TEOS and REOX gate oxides, respectively.

FIG. 18 illustrates an I-V characteristic of TEOS and REOX gate oxides, respectively. The I-V characteristic was investigated at 25° C. The leakage of gate oxides from the proposed process (ISSG plus REOX) were compared oxides from a common thermal dry oxidation plus TEOS LPCVD. The REOX oxide without anneal shows a lower gate leakage and a similar breakdown voltage of 10 MV/cm compared to the annealed TEOS oxide (FIG. 7). The investigation also proves that annealing TEOS oxides is important for the quality of the gate oxide. The TEOS oxides without anneal already broke down at 9.5 MV/cm.

In addition to the above, a process for generating a gate oxide of silicon carbide MOSFETs and IGBTs is described in further detail below. In particular, generating a gate oxide on a silicon carbide wafer (i.e., a semiconductor layer) may include depositing, on the silicon carbide surface, a layer of silicon nitride (or else, possibly, a layer of silicon oxynitride) which is subsequently oxidized by a thermal oxidation procedure without causing partial oxidation of the SiC interface. Procedural variants suitable for the oxidation step are those which generate oxygen radicals and as a result are highly reactive. This is a precondition for the oxidation of silicon nitride. A further advantage may be the oxidation rate, which is independent of crystal orientation. Suitable procedural variants include ISSG oxidation (performed between 800° C. . . . 1050° C.), oxidation batch radical oxidation (performed between 800° C. . . . 1050° C.), or plasma oxidation (preformed at about 400° C.). The oxides generated by means of such methods are oxides of high density which are therefore also very reliable.

In addition, all of these procedural variants are self-limiting and stop at thicknesses of roughly ~15 nm. If a similar thickness is selected for the silicon nitride layer, it is possible to prevent the oxidation of the SiC under the $Si_3N_4$ layer—not least on account of the low operating temperatures possible (particularly in the case of using plasma oxidation). As a result, significantly improved interface quality is likely, since the absence of SiC oxidation means that no carbon-correlated defects can come about. This implies fewer scattering centers at the channel interface and hence also improved channel mobility in the MOS channel.

In order to realize the required overall thickness of the gate oxide, a corresponding oxide deposition may take place subsequently. Furthermore, a final hydrogen heat treatment may be applied as in the case of oxides on silicon, as well may be necessary in order to neutralize remaining open bonds.

For achieving a further increase in the channel mobility, it is possible as an optional step, before the proposed gate oxide procedure, to deposit a thin layer of polysilicon and to heat it by laser annealing. In that case, the polysilicon layer takes up carbon from the SiC crystal. The carbon content can be adjusted by back-etching of the resulting layer. This is followed by the operation described above of producing the gate oxide. Alternatively, a plasma doping (PLAD) operation may be used to dope the SiC crystal with Si, in order to counteract any remaining accumulation of carbon during the oxidation.

Thus, in view of the above, a high-quality gate oxide may be generated on a SiC wafer with a satisfactory mobility in the MOS channel, by depositing a silicon nitride on silicon carbide wafers and subsequently oxidizing it completely, using a method based on oxidation with oxygen radicals. The final gate oxide thickness is generated subsequently by deposition.

Thus, a method of manufacturing according to one or more embodiments includes a deposition of the thin layer of silicon (oxy)nitride, which is 15 nm thick, and is accomplished preferably by means of an oven procedure. The heat treatment may take place preferably in situ after deposition of the thin layer of silicon (oxy)nitride, in order to reduce further the number of handling steps and the loading and unloading time associated with the oven operation. In order to improve further the crystal structure of the silicon layer, this layer may also be subjected to a short melting or a non-melting laser step or, alternatively or additionally, to a rapid thermal annealing (RTA) step.

The silicon-silicon (oxy)nitride stack is oxidized preferably by a thermal oxidation step using oxygen radicals, preferably in a temperature range of less than or equal to 800° C.

The oxidation process of the silicon (oxy)nitride layer is self-limiting and stops at an oxide thickness of 15 nm or about 15 nm. The thickness of the silicon (oxy)nitride layer will therefore preferably correspond to this thickness, in order to prevent oxidation on the SiC surface.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a semiconductor device, the method comprising:

forming a body structure and a drift zone in a semiconductor layer, wherein the body structure and the drift zone form a first pn junction;

forming, during a first iteration, a first silicon nitride layer on the semiconductor layer;

forming, during the first iteration, a first silicon oxide layer from at least a vertical section of the first silicon nitride layer by oxygen radical oxidation; and performing a second iteration including (i) forming a second silicon nitride layer on a portion of the first silicon oxide layer formed in the first iteration and (ii)

transforming the second silicon nitride layer into a second silicon oxide layer by oxygen radical oxidation.

2. The method of claim 1, wherein the silicon oxide layer has a thickness of at least 15 nm.

3. The method of claim 1, wherein the first silicon nitride layer is formed directly on the semiconductor layer.

4. The method of claim 1, further comprising:
forming, before forming the first silicon nitride layer, a dielectric intermediate layer directly on the semiconductor layer, wherein the first silicon nitride layer is formed directly on the dielectric intermediate layer.

5. The method of claim 4, wherein the dielectric intermediate layer is from silicon oxide.

6. The method of claim 4, wherein the dielectric intermediate layer has a thickness of at least 3 nm.

7. The method of claim 1, wherein the semiconductor layer is based on silicon carbide.

8. The method of claim 1, wherein forming the first silicon oxide layer comprises a co-injection of molecular oxygen $O_2$ and molecular hydrogen $H_2$ into a process chamber at conditions inhibiting a reaction of molecular oxygen $O_2$ and molecular hydrogen $H_2$ in a gas phase.

9. The method of claim 8, wherein the first silicon oxide layer is formed at a temperature below 300° C.

10. The method of claim 1, wherein forming the first silicon oxide layer comprises an injection of molecular oxygen $O_2$ or a mixture of molecular oxygen $O_2$ and molecular hydrogen $H_2$ into a process chamber at conditions inhibiting a reaction of molecular oxygen $O_2$ and molecular hydrogen $H_2$ in a gas phase and forming a microwave plasma along a front side of the semiconductor layer.

11. The method of claim 1, wherein the oxygen radical oxidation is terminated before the oxygen radical oxidation completely consumes the first silicon nitride layer.

12. The method of claim 1, wherein the oxygen radical oxidation is terminated with the first silicon nitride layer completely consumed by the oxygen radical oxidation.

13. The method of claim 1, wherein the oxygen radical oxidation is terminated after the oxygen radical oxidation has consumed a portion of the semiconductor layer.

14. The method of claim 1, wherein the first silicon nitride layer is formed by low-pressure chemical vapor deposition.

15. The method of claim 1, further comprising:
forming a dielectric supplementary layer directly on the second silicon oxide layer.

16. The method of claim 1, further comprising:
forming gate trenches extending from a front surface at a front side into the body structure, wherein the first silicon oxide layer is formed parallel to sidewalls of the gate trenches.

17. The method of claim 1, further comprising:
forming a gate electrode on the second silicon oxide layer.

18. The method of claim 17, further comprising:
forming a plurality of electrically connected source zones forming second pn junctions with the body structure.

19. The method of claim 1, further comprising:
forming a plurality of interconnected gate electrodes of transistor cells electrically connected in parallel to each other.

20. The method of claim 1, wherein the second silicon oxide layer forms a further portion of the first silicon oxide layer.

21. The method of claim 1, further comprising:
performing a third iteration including (i) forming a third silicon nitride layer on a portion of the second silicon oxide layer formed in the second iteration and (ii) transforming the third silicon nitride layer into a third silicon oxide layer by oxygen radical oxidation.

22. The method of claim 21, wherein the third silicon oxide layer forms a further portion of the second silicon oxide layer.

23. The method of claim 21, wherein the third silicon oxide layer forms a further portion of the first silicon oxide layer and the second silicon oxide layer.

24. The method of claim 21, further comprising:
forming a dielectric supplementary layer directly on the third silicon oxide layer.

25. The method of claim 21, further comprising:
forming a gate electrode on the third silicon oxide layer.

26. The method of claim 21, further comprising:
performing a further iteration including (i) forming a further silicon nitride layer on a portion of the third silicon oxide layer formed in the third iteration and (ii) transforming the further silicon nitride layer into a further silicon oxide layer by oxygen radical oxidation.

27. The method of claim 1, further comprising:
performing a plurality of further iterations on the second silicon oxide layer, the plurality of further iterations comprising (i) forming a further silicon nitride layer and (ii) transforming the further silicon nitride layer into a further silicon oxide layer by oxygen radical oxidation, wherein the further silicon nitride layer of iteration (m) is formed on a portion of the further silicon oxide layer formed in iteration (m−1), wherein the iteration (m) and the iteration (m−1) are adjacent iterations and the iteration (m) is performed subsequent to the iteration (m−1), where m is an integer.

* * * * *